(12) United States Patent
Du et al.

(10) Patent No.: US 12,232,372 B2
(45) Date of Patent: Feb. 18, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Hongjun Zhou, Beijing (CN); Wen Tan, Beijing (CN); Cong Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 698 days.

(21) Appl. No.: 17/280,752

(22) PCT Filed: Jun. 29, 2020

(86) PCT No.: PCT/CN2020/098898
§ 371 (c)(1),
(2) Date: Mar. 26, 2021

(87) PCT Pub. No.: WO2022/000179
PCT Pub. Date: Jan. 6, 2022

(65) Prior Publication Data
US 2022/0199739 A1 Jun. 23, 2022

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/123* (2023.02);
(Continued)

(58) Field of Classification Search
CPC .. H10K 59/131; H10K 59/123; H10K 59/353; H10K 59/352; G09G 3/3233;
(Continued)

(56) References Cited

U.S. PATENT DOCUMENTS

2005/0184937 A1 8/2005 Lee
2006/0114190 A1 6/2006 Fang et al.
(Continued)

FOREIGN PATENT DOCUMENTS

CN 104078001 A 10/2014
CN 104143562 A 11/2014
(Continued)

*Primary Examiner* — Shaun M Campbell
(74) *Attorney, Agent, or Firm* — Scully, Scott, Murphy & Presser, P.C.

(57) ABSTRACT

A display panel and a display device are provided. The display panel includes: a plurality of first pixel units, a plurality of second pixel units, a plurality of third pixel units and a plurality of first data lines. An effective light-emitting area of the first pixel unit is larger than an effective light-emitting area of the second pixel unit, and larger than an effective light-emitting area of the third pixel unit; orthographic projection of the first data line on the base substrate is not overlapped with an orthographic projection of any one of the first electrode of the first pixel unit, the first electrode of the second pixel unit, and the first electrode of the third pixel unit on the base substrate.

18 Claims, 21 Drawing Sheets

(51) Int. Cl.
*H10K 59/123* (2023.01)
*H10K 59/35* (2023.01)

(52) U.S. Cl.
CPC .............. *G09G 2300/0426* (2013.01); *G09G 2300/0452* (2013.01); *G09G 2300/0842* (2013.01); *G09G 2310/0202* (2013.01); *H10K 59/352* (2023.02); *H10K 59/353* (2023.02)

(58) Field of Classification Search
CPC ... G09G 2300/0426; G09G 2300/0452; G09G 2300/0842; G09G 2310/0202
See application file for complete search history.

(56) References Cited

U.S. PATENT DOCUMENTS

| | | | |
|---|---|---|---|
| 2014/0284570 A1* | 9/2014 | Jinta | H10K 59/352 |
| | | | 257/40 |
| 2014/0332771 A1 | 11/2014 | Byun | |
| 2019/0064239 A1* | 2/2019 | Lee | G01R 31/70 |
| 2020/0119114 A1* | 4/2020 | Kim | H10K 59/122 |
| 2020/0286970 A1 | 9/2020 | Yu | |
| 2021/0151711 A1 | 5/2021 | Xu | |
| 2021/0159283 A1* | 5/2021 | Cai | H10K 59/122 |
| 2021/0376019 A1* | 12/2021 | Kim | H10K 59/131 |

FOREIGN PATENT DOCUMENTS

| | | | |
|---|---|---|---|
| CN | 109065754 A | 12/2018 | |
| CN | 110444691 A | 11/2019 | |
| CN | 110767714 A | 2/2020 | |
| CN | 110808340 A | 2/2020 | |
| CN | 110943111 A | 3/2020 | |

\* cited by examiner

LY1

Rst/112

110

C11/T10

113

Rst/111

ISL1

ISL2

V202
V201  V203

DISPLAY PANEL AND DISPLAY DEVICE

TECHNICAL FIELD

The embodiments of the present disclosure relate to a display panel and a display device.

BACKGROUND

As a new generation of display technology, Organic light-emitting diode (OLED) display device is favored by the market because of its display characteristics of self-illumination, wide viewing angle, wide color gamut, fast response time, and high contrast, as well as its advantages of energy saving, lightness, flexibility, good shock resistance, and high brightness.

SUMMARY

Embodiments of the present disclosure provide a display panel and a display device.

At least one embodiment of the present disclosure provides a display panel, including: a plurality of pixel units, arranged on a base substrate in an array; the pixel unit including a pixel circuit and a light-emitting element, the light-emitting element including a first electrode connected with the pixel circuit, and the plurality of pixel units including a plurality of first pixel units, a plurality of second pixel units, and a plurality of third pixel units, an effective light-emitting area of the first pixel unit being larger than an effective light-emitting area of the second pixel unit, and larger than an effective light-emitting area of the third pixel unit; and a plurality of first data lines, the first data line is configured to provide a first data signal to the pixel circuit of the first pixel unit; the first electrode of the first pixel unit, the first electrode of the second pixel unit, and the first electrode of the third pixel unit are arranged apart from each other, and an orthographic projection of the first data line on the base substrate is not overlapped with an orthographic projection of any one of the first electrode of the first pixel unit, the first electrode of the second pixel unit, and the first electrode of the third pixel unit on the base substrate.

In one or some of the embodiments of the present disclosure, connection lines among a center of the effective light-emitting area of the first pixel unit, a center of the effective light-emitting area of the second pixel unit, and a center of the effective light-emitting area of the third pixel unit form a triangle, and the first electrode of the second pixel unit and the first electrode of the third pixel units are arranged along an extending direction of the first data line, and the first electrode of the first pixel unit extends along the extending direction of the first data line.

In one or some of the embodiments of the present disclosure, the triangle is an acute triangle.

In one or some of the embodiments of the present disclosure, the display panel further includes a plurality of second data lines, wherein the second data line is configured to provide a second data signal to the pixel circuit of the second pixel unit, and an orthographic projection of first electrode of the first pixel unit on the base substrate is overlapped with an orthographic projection of one of the plurality of second data lines on the base substrate.

In one or some of the embodiments of the present disclosure, orthographic projection of the first electrode of the second pixel unit on the base substrate and orthographic projection of the first electrode of the third pixel unit on the base substrate are not overlapped with orthographic projections of the plurality of second data lines on the base substrate.

In one or some of the embodiments of the present disclosure, the display panel further includes a plurality of third data lines, wherein the third data line is configured to provide a third data signal to pixel circuit of the third pixel unit, and the first data line, the third data line, and the second data line are arranged along a first direction, and the first direction intersects with the extending direction of the first data line.

In one or some of the embodiments of the present disclosure, an orthographic projection of at least one of the first electrode of the second pixel unit or the first electrode of the third pixel unit on the base substrate is partially overlapped with an orthographic projection of one of the plurality of third data lines on the base substrate.

In one or some of the embodiments of the present disclosure, an area of an portion of the first electrode of the first pixel unit overlapped with the second data line is larger than an area of an portion of at least one of the first electrode of the second pixel unit or the first electrode of the third pixel unit overlapped with the third data line.

In one or some of the embodiments of the present disclosure, orthographic projections of the first electrode of the second pixel unit and the first electrode of the third pixel unit on the base substrate are both overlapped with the orthographic projection of the third data line on the base substrate; the area of the portion of the first electrode of the first pixel unit overlapped with the second data line, the area of the portion of the first electrode of the second pixel unit overlapped with the third data line, and the area of the portion of the first electrode of the third pixel unit overlapped with the third data line sequentially decrease.

In one or some of the embodiments of the present disclosure, the display panel further includes a first insulating layer, a connection element, and a second insulating layer, wherein the first insulating layer, the connection element, and the second insulating layer are sequentially arranged from a position close to the base substrate to a position far away from the base substrate, the first electrode of the first pixel unit is connected with the pixel circuit through the connection element, the connection element is connected with the pixel circuit through a first via hole penetrating through the first insulating layer, and the first electrode is connected with the connection element through a second via hole penetrating through the second insulating layer, an orthographic projection of the first via hole on the base substrate is not overlapped with an orthographic projection of the second via hole on the base substrate.

In one or some of the embodiments of the present disclosure, the pixel circuit includes a first transistor, the first transistor includes a source electrode and a drain electrode, the first electrode of the first pixel unit is connected with the source electrode or the drain electrode of the first transistor through the connection element.

In one or some of the embodiments of the present disclosure, a dimension of the first via hole in a direction perpendicular to the base substrate is smaller than a dimension of the second via hole in the direction perpendicular to the base substrate.

In one or some of the embodiments of the present disclosure, a maximum dimension of the first via hole in a plane parallel to the base substrate is smaller than a maximum dimension of the second via hole in the plane parallel to the base substrate.

In one or some of the embodiments of the present disclosure, the first insulating layer includes a first gate insulating layer, a second gate insulating layer, and an interlayer insulating layer, and the second insulating layer includes a planarization layer.

In one or some of the embodiments of the present disclosure, a material of the first insulating layer includes an inorganic insulating material, and a material of the second insulating layer includes an organic insulating material.

In one or some of the embodiments of the present disclosure, an orthographic projection of a connection line between midpoints of two opposite sides of the first pixel unit on the base substrate passes through the orthographic projection of the second via hole on the base substrate, the two opposite sides extend along the extending direction of the first data line, and the second via hole is located at an edge of the first electrode of the first pixel unit.

In one or some of the embodiments of the present disclosure, a distance between a second via hole of the third pixel unit and the first electrode of the first pixel unit which is closest to the second via hole of the third pixel unit is greater than or equal to 3.5 microns, and a distance between the second via hole of the third pixel unit and the first electrode of the second pixel unit which is closest to the second via hole of the third pixel unit is greater than or equal to 3.5 microns.

In one or some of the embodiments of the present disclosure, a distance between a second via hole of the second pixel unit and the first electrode of the first pixel unit which is closest to the second via hole of the second pixel unit is greater than or equal to 3.5 microns, and a distance between the second via hole of the second pixel unit and the first electrode of the third pixel units which is closest to the second via hole of the second pixel unit is greater than or equal to 3.5 microns.

In one or some of the embodiments of the present disclosure, the pixel circuit includes a second transistor, the second transistor is connected with the first transistor and configured to supply a driving current to the light-emitting element, the first electrode of the third pixel unit is not overlapped with the second transistor.

In one or some of the embodiments of the present disclosure, the first electrode of the second pixel unit is not overlapped with the second transistor of the second pixel unit, and the first electrode of the second pixel unit is overlapped with the second transistor of the third pixel unit.

In one or some of the embodiments of the present disclosure, the first electrode of the first pixel unit is partially overlapped with the second transistor of the second pixel unit, and is partially overlapped with the second transistor of the first pixel unit.

In one or some of the embodiments of the present disclosure, a spacer is provided between the first electrodes of two adjacent ones of the first pixel units arranged in the extending direction of the first data line.

In one or some of the embodiments of the present disclosure, an orthographic projection of the spacer on the base substrate is not overlapped with the orthographic projections of the first electrodes of the first pixel units on the base substrate.

In one or some of the embodiments of the present disclosure, the spacer is located in a region surrounded by the first electrodes of two adjacent ones of the first pixel units, the first electrodes of two adjacent ones of the second pixel units, and the first electrodes of two adjacent ones of the third pixel units.

In one or some of the embodiments of the present disclosure, no spacer is provided between the first electrodes of the second pixel unit and the third pixel unit which are arranged adjacent to each other in the extending direction of the first data line.

In one or some of the embodiments of the present disclosure, the effective light-emitting area of the second pixel units is larger than the effective light-emitting area of the third pixel unit.

In one or some of the embodiments of the present disclosure, the first pixel unit includes a blue pixel unit, one of the second pixel unit and the third pixel unit is a green pixel unit, and the other one of the second pixel unit and the third pixel unit is a red pixel unit.

In one or some of the embodiments of the present disclosure, the light-emitting element includes an organic light-emitting diode.

At least one embodiment of the present disclosure further provides a display device including any one of the above described display panel.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise specified, the technical terms or scientific terms used in the present disclosure should be of general meaning as understood by those ordinarily skilled in the art. In the disclosure, words such as "first", "second" and the like do not denote any order, quantity, or importance, but rather are used for distinguishing different components. Similarly, words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of the described object is changed, the relative positional relationship may also be correspondingly changed.

Generally, the pixel arrangement of an OLED screen can be divided into Pentile and real RGB.

Figure 1:
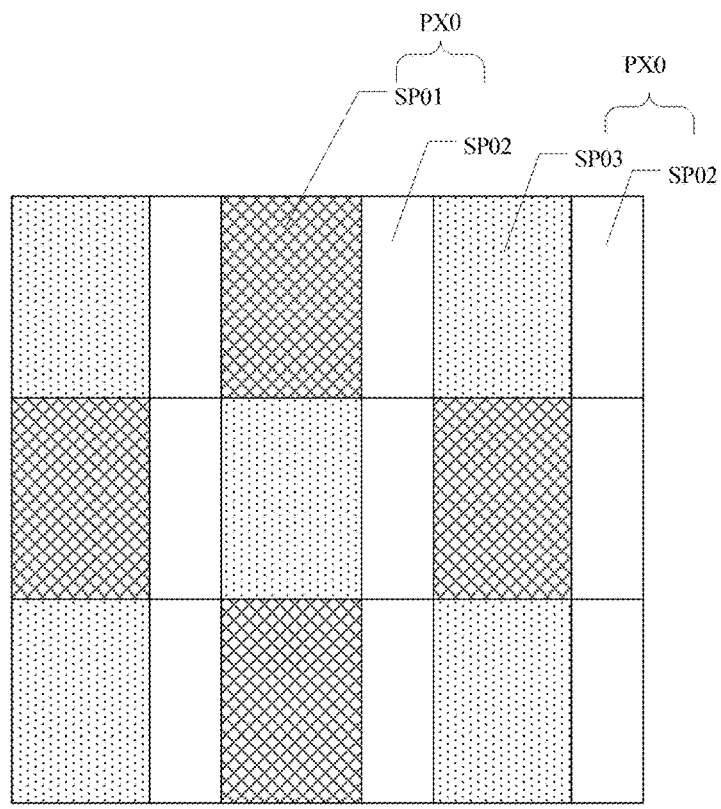
FIG. 1 is a schematic diagram of pixel distribution of Pentile arrangement.

FIG. 1 is a schematic diagram of pixel distribution of Pentile arrangement. As illustrated by FIG. 1, the OLED display panel includes a blue (B) sub-pixel SP01, a green (G) sub-pixel SP02, and a red (R) sub-pixel SP03. Pentile arrangement mainly reduces the number of sub-pixels by sharing sub-pixels with adjacent pixels, so as to achieve the effect of simulating high resolution with low resolution. For example, in Pentile arrangement, four sub-pixels R\G\B\G form two pixels (equivalent to that two sub-pixels form one pixel PX0), which requires IC compensation processing and can realize high-resolution product display. However, in Pentile arrangement display, there are often some problems, such as pattern edge sawtooth, color edge phenomenon, and screen color shift. In Real RGB arrangement, three sub-pixels R\G\B form one pixel, so compensation processing is not needed; Pentile problems as described above are not often appear in OLED screen with Real RGB arrangement, and Real RGB arrangement is often applied to small-size display products with low resolution. The real RGB arrangement can be divided into a standard RGB arrangement and a new RGB arrangement.

Figure 2:
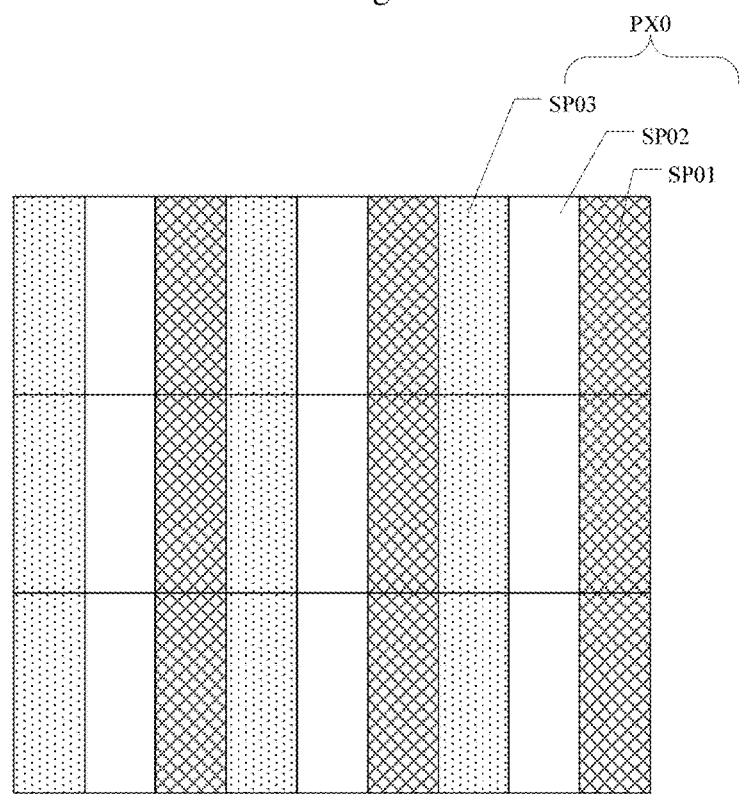
FIG. 2 is a schematic diagram of pixel distribution of a standard RGB arrangement.

FIG. 2 is a schematic diagram of pixel distribution of a standard RGB arrangement. As illustrated by FIG. 2, in the real RGB arrangement, each pixel PX0 includes a blue sub-pixel SP01, a green sub-pixel SP02, and a red sub-pixel SP03; a plurality of pixels PX0 are arranged in an array. As illustrated by FIG. 2, in the standard RGB arrangement, a ratio of the effective light-emitting areas of the red sub-pixel, the green sub-pixel, and the blue sub-pixel are 1:1:1.

The three kinds of the primary color sub-pixels of OLED devices have different lifetimes; blue sub-pixel has the shortest lifetimes and green sub-pixel has the longest lifetimes, while the lifetimes of red sub-pixel lies between the lifetimes of green sub-pixel and the lifetimes of blue sub-pixel, resulting in the largest working voltage difference of blue sub-pixel. For example, among the three sub-pixels R, G and B, the blue sub-pixel is the largest in working voltage difference and power consumption at the same brightness.

Figure 3:
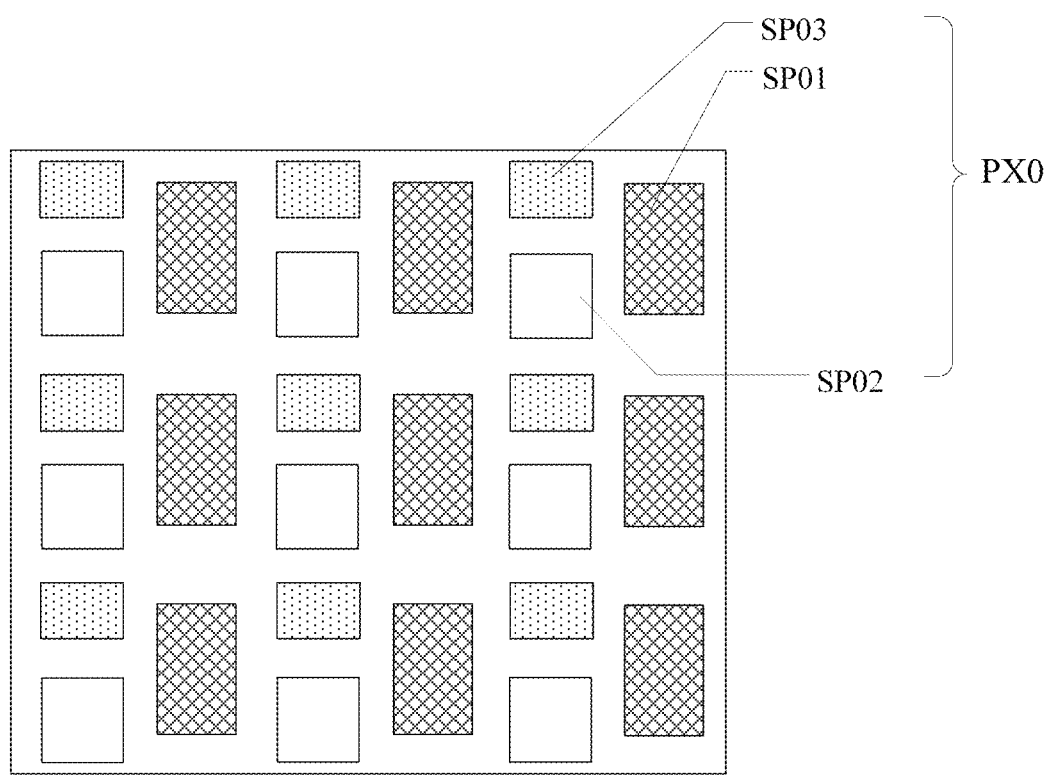
FIG. 3 is a schematic diagram of pixel distribution of a new RGB arrangement.

FIG. 3 is a schematic diagram of pixel distribution of a new RGB arrangement. As illustrated by FIG. 3, the pixels of the new RGB arrangement reduce the brightness of the blue sub-pixel by increasing the effective light-emitting area of the blue sub-pixel SP01, thus ensuring the lifetime. As illustrated by FIG. 3, each pixel PX0 includes a blue sub-pixel SP01, a green sub-pixel SP02, and a red sub-pixel SP03; the plurality of pixels PX0 is arranged in an array. As illustrated by FIG. 3, the effective light-emitting area of blue sub-pixel is larger than that of red sub-pixel and larger than that of green sub-pixel.

Figure 4:
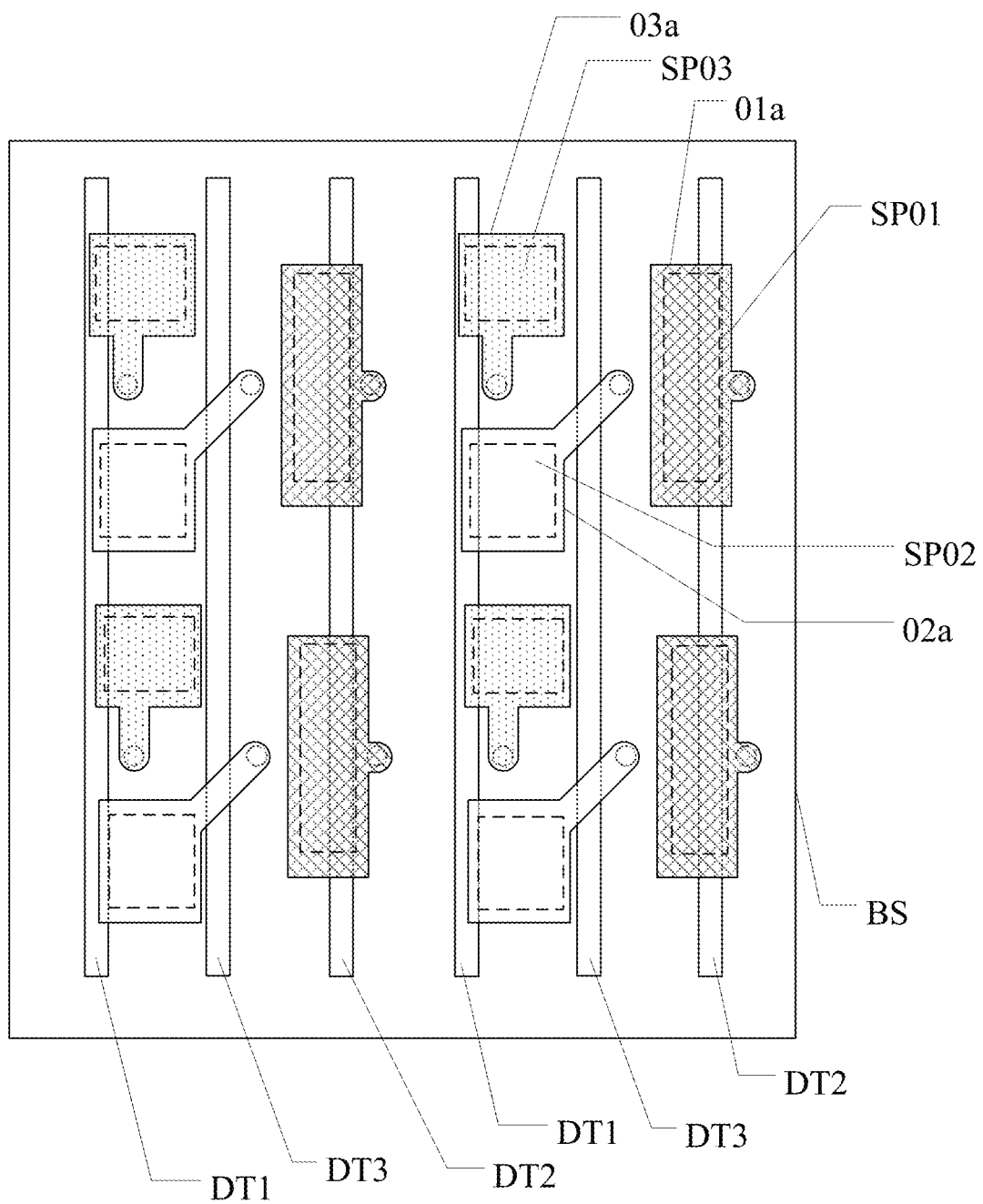
FIG. 4 is a schematic diagram of a display panel.
Figure 5:
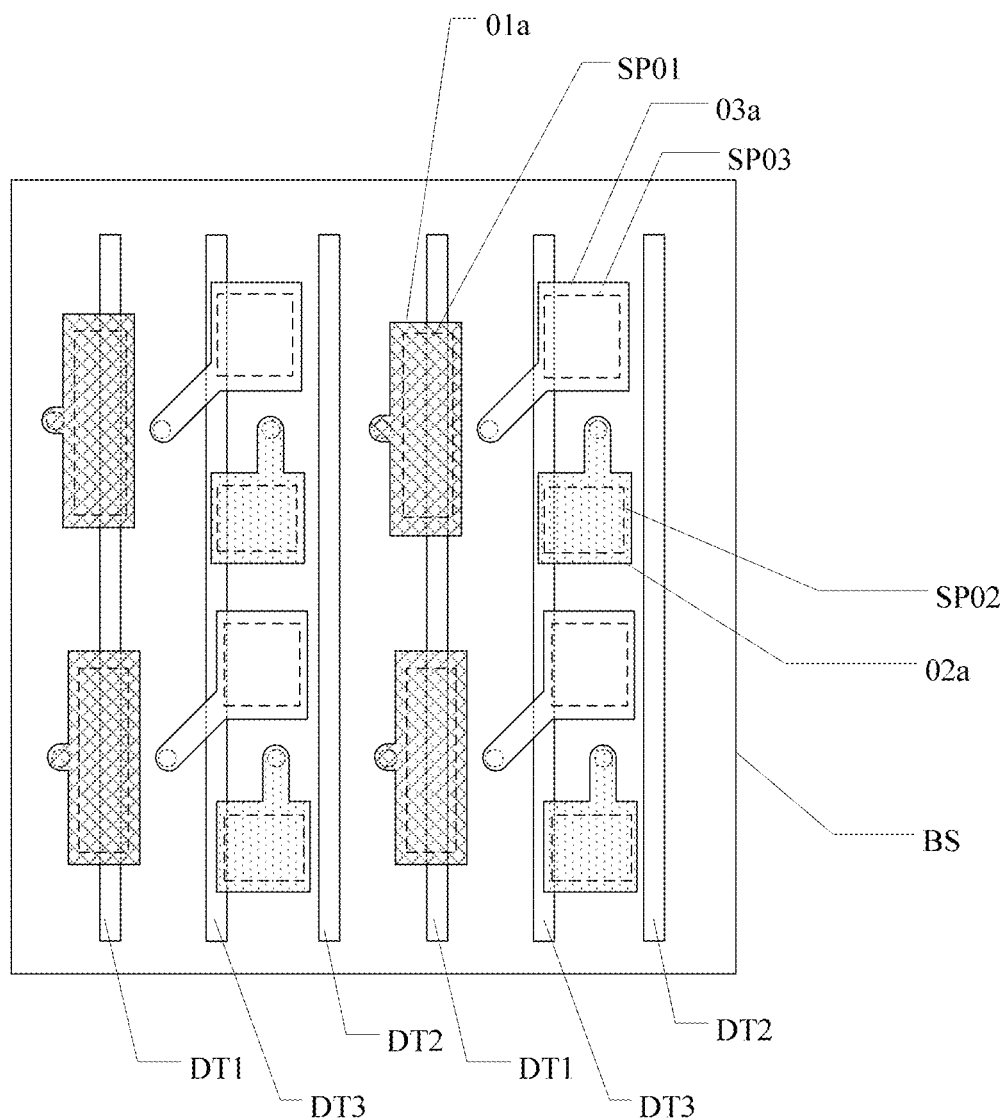
FIG. 5 is a schematic diagram of another display panel.

FIG. 4 is a schematic diagram of a display panel. FIG. 5 is a schematic diagram of another display panel. The dashed boxes in FIG. 4 and FIG. 5 represent the effective light-emitting areas of sub-pixels. The display panels shown in FIG. 4 and FIG. 5 both adopt a new RGB arrangement mode for pixel arrangement.

As illustrated by FIGS. 4 and 5, the display panel further includes a plurality of first data lines DT1, a plurality of second data lines DT2, a plurality of third data lines DT3, a plurality of first first electrodes 01a, a plurality of second first electrodes 02a, and a plurality of third first electrodes 03a. For example, each sub-pixel includes a pixel circuit and a light-emitting element. The pixel circuit is configured to supply a driving current to the light-emitting element to drive the light-emitting element to emit light. For example, the first data line DT1 is configured to provide a first data signal to the pixel circuit of the blue sub-pixel SP01; the second data line DT2 is configured to provide a second data signal to the pixel circuit of the green sub-pixel SP02; and the third data line DT3 is configured to provide a third data signal to the pixel circuit of the red sub-pixel SP03. The light-emitting element of blue sub-pixel SP01 includes the first electrode 01a, the light-emitting element of green sub-pixel SP02 includes the first electrode 02a, and the light-emitting element of red sub-pixel SP03 includes the first electrode 03a.

As illustrated by FIGS. 4 and 5, the display panel includes a base substrate BS. As illustrated by FIG. 4, an orthographic projection of the first data line DT1 on the base substrate BS is overlapped with orthographic projections of the first electrode 02a and the first electrode 03a on the base substrate BS. As illustrated by FIG. 5, the orthographic projection of the first data line DT1 on the base substrate BS is overlapped with the orthographic projections of the first electrode 01a on the base substrate BS.

The first data line DT1 supplying the first data signal to the pixel circuit of the blue sub-pixel SP01 is partially overlapped with the first electrode of the light-emitting element in a direction perpendicular to the base substrate, so that the load is large.

Figure 6:
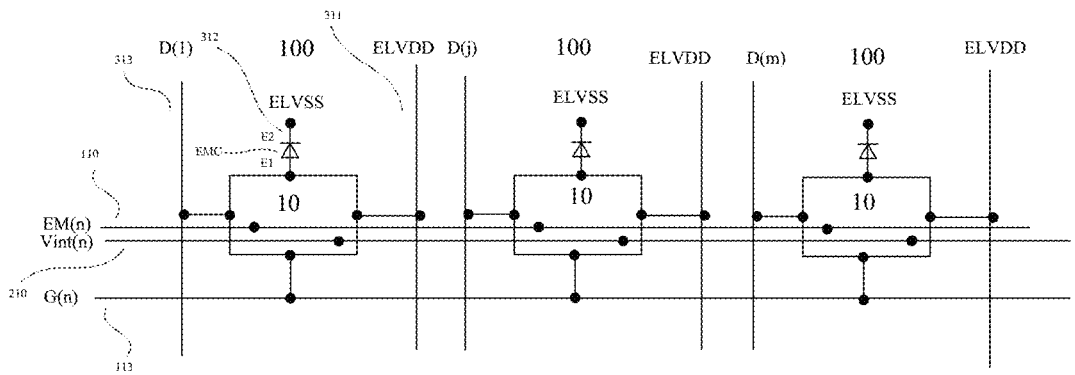
FIG. 6 is a schematic diagram of a pixel unit in a display panel and a signal line providing signals for the pixel unit according to an embodiment of the present disclosure.

FIG. 6 is a schematic diagram of a pixel unit in a display panel and signal lines providing signals for the pixel unit according to an embodiment of the present disclosure. As illustrated by FIG. 6, the display panel includes a plurality of pixel units 100 arranged in an array on a base substrate BS; each pixel unit 100 including a light-emitting element EMC and a pixel circuit 10 providing driving current for the light-emitting element EMC; the light-emitting element EMC can be an electroluminescent element, for example, an organic electroluminescent element, for example, an organic light-emitting diode (OLED).

As illustrated by FIG. 6, the display panel further includes an initialization signal line 210, a light emission control signal line 110, a data line 313, a first power line 311, and a second power line 312. For example, the gate line 113 is configured to supply a scan signal SCAN to the pixel circuit 10. The light emission control signal line 110 is configured to provide a light emission control signal EM to the pixel unit 100. The data line 313 is configured to provide a data signal DATA to the pixel circuit 100; the first power line 311 is configured to provide a constant first voltage signal ELVDD to the pixel circuit 10; and the second power line 312 is configured to provide a constant second voltage signal ELVSS; and the first voltage signal ELVDD is larger than the second voltage signal ELVSS. The initialization signal line 210 is configured to provide an initialization signal Vint to the pixel circuit 10. The initialization signal Vint is a constant voltage signal, and its magnitude can be between the first voltage signal ELVDD and the second voltage signal ELVSS, but is not limited to this. For example, the initialization signal Vint can be less than or equal to the second voltage signal ELVSS. For example, the pixel circuit 10 outputs a driving current to drive the light-emitting element EMC to emit light under the control of the signals such as scan signal SCAN, data signal DATA, initialization signal Vint, first voltage signal ELVDD, second voltage signal ELVSS, and emission control signal EM. As illustrated by FIG. 6, the light-emitting element EMC includes a first electrode E1 and a second electrode E2. The first electrode E1 is connected to the pixel circuit 10, and the second electrode E2 is connected to the second power line 312.

Figure 7:
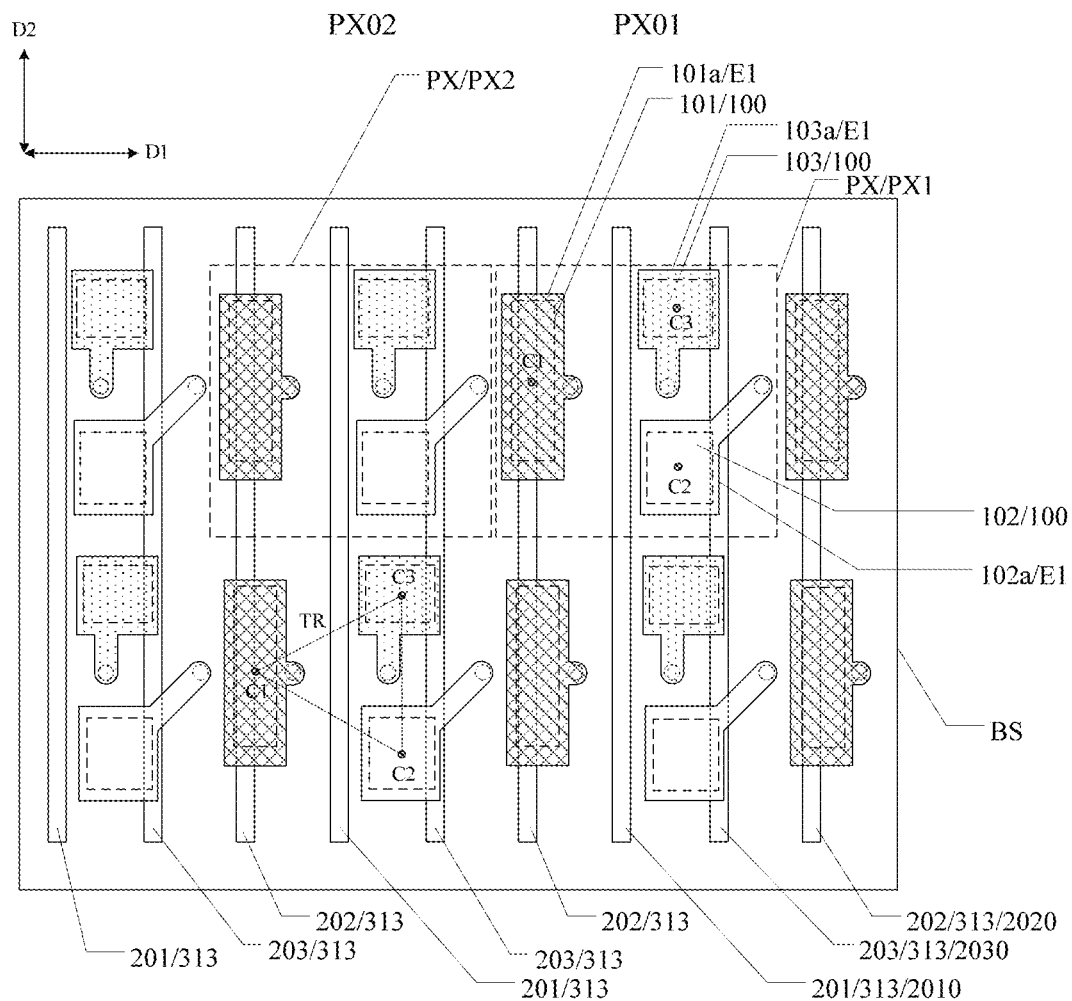
FIG. 7 is a schematic diagram of a display panel according to an embodiment of the present disclosure.

FIG. 7 is a schematic diagram of a display panel according to an embodiment of the present disclosure. As illustrated by FIG. 7, the display panel includes a base substrate BS, a plurality of pixel units 100, and a plurality of first data lines 201. As illustrated by FIG. 7, the plurality of pixel units 100 include a plurality of first pixel units 101, a plurality of second pixel units 102, and a plurality of third pixel units 103; and an effective light-emitting area of the first pixel unit 101 is larger than that of the second pixel unit 102 and that of the third pixel unit 103.

For example, as illustrated by FIG. 7, the effective light-emitting area of the second pixel unit 102 is larger than that of the third pixel unit 103. Of course, in other embodiments, the effective light-emitting area of the second pixel unit 102 may be smaller than that of the third pixel unit 103. In an embodiment of the present disclosure, the effective light-emitting area can refer to the actual light-emitting area of the pixel unit. For example, the actual light-emitting area may correspond to an opening area of the pixel defining layer. The pixel unit may include an actual light-emitting area and a non-light-emitting area surrounding the actual light-emitting area.

For example, as illustrated by FIG. 7, the first pixel unit 101 includes a blue pixel unit, one of the second pixel unit 102 and the third pixel unit 103 is a green pixel unit, and the other of the second pixel unit 102 and the third pixel unit 103 is a red pixel unit. In the display panel shown in FIG. 7, as an example, the first pixel unit 101 is a blue pixel unit, the second pixel unit 102 is a green pixel unit, and the third pixel unit 103 is a red pixel unit.

For example, referring to FIGS. 6 and 7, the display panel includes a plurality of first data lines 201 configured to provide first data signals to the pixel circuits 10 of the plurality of first pixel units 101. The first electrode 101a of the first pixel unit 101, the first electrode 102a of the second pixel unit 102, and the first electrode 103a of the third pixel unit 103 are spaced apart from each other; and orthographic projections of the first data lines 201 on the base substrate BS are not overlapped with an orthographic projection of any one of the first electrode 101a of the first pixel unit 101, the first electrode 102a of the second pixel unit 102, and the first electrode 103a of the third pixel unit 103 on the base substrate. For example, in the embodiment of the present disclosure, the first electrode 101a of the first pixel unit 101, the first electrode 102a of the second pixel unit 102, and the first electrode 103a of the third pixel unit 103 are the first electrodes E1 shown in FIG. 6.

In the embodiment of the present disclosure, the orthographic projection of the first data line 201 providing the first data signal to the pixel circuit 10 of the first pixel unit 101 on the base substrate BS is not overlapped with the orthographic projection of any one of the first electrode 101a of the first pixel unit 101, the first electrode 102a of the second pixel unit 102, and the first electrode 103a of the third pixel unit 103 on the base substrate BS, which can reduce the load of the first data line 201 and further achieve a purpose of reducing the working voltage difference and power consumption of the first pixel unit 101. In the case where the first pixel unit 101 is a blue pixel unit, the above arrangement in the embodiment of the present disclosure can reduce the load of the blue pixel unit, achieve the purpose of reducing the working voltage difference and power consumption of the blue pixel unit, thereby reducing the power consumption, improving the product yield and lifetimes, and improving the display effect.

For example, as illustrated by FIG. 7, connection lines among a center C1 of the effective light-emitting area of the first pixel unit 101, a center C2 of the effective light-emitting area of the second pixel unit 102, and a center C3 of the third pixel unit 103 constitutes a triangle TR; for example, the connection lines among the center of the first electrode 101a of the first pixel unit 101, the center of the first electrode 102a of the second pixel unit 102, and the center of the first electrode 103a of the third pixel unit 103 constitutes a triangle, for example, an acute triangle. However, the embodiments of the present disclosure are not limited thereto. FIG. 7 shows a center of the first pixel unit 101, a center of the second pixel unit 102, and a center of the third pixel unit 103. For example, the center of the pixel unit may refer to a center of the effective light-emitting area of the pixel unit, but the present disclosure is not limited thereto. The center of the effective light-emitting area may refer to a geometric center of the effective light-emitting area. As illustrated by FIG. 7, the effective light-emitting area of the first pixel unit 101, the effective light-emitting area of the second pixel unit 102, and the effective light-emitting area of the third pixel unit 103 are all rectangular. Of course, in other embodiments, the effective light-emitting area of the first pixel unit 101, the effective light-emitting area of the second pixel unit 102, and the effective light-emitting area of the third pixel unit 103 can also have other shapes, and the embodiments of the present disclosure are not limited thereto.

For example, as illustrated by FIG. 7, the first electrodes 102a of the second pixel units 102 and the first electrodes 103a of the third pixel units 103 are arranged along an extending direction of the first data lines 201, and the first electrode 101a of the first pixel unit 101 extends along the extending direction of the plurality of first data lines 201. As illustrated by FIG. 7, an arrangement direction of the plurality of first data lines 201 is a first direction D1, and the extension direction of the first data lines 201 is a second direction D2. For example, the first direction D1 intersects with the second direction D2. Further, for example, the first direction D1 is perpendicular to the second direction D2. The embodiments of the present disclosure are described by taking the first direction D1 perpendicular to the second direction D2 as an example.

For example, referring to FIGS. 6 and 7, the display panel further includes a plurality of second data lines 202 configured to provide second data signals to the pixel circuits 10 of the second pixel units 102. In order to improve the aperture ratio of pixels, an orthographic projection of the first electrode 101a of the first pixel unit 101 on the base substrate BS is partially overlapped with an orthographic projection of one of the plurality of second data lines 202 on the base substrate BS.

For example, as illustrated by FIG. 7, in order to reduce the load of the second data line 202, orthographic projections of the first electrode 102a of the second pixel unit 102 and the first electrode 103a of the third pixel unit 103 on the base substrate BS are not overlapped with orthographic projections of the plurality of second data lines 202 on the base substrate BS.

For example, referring to FIGS. 6 and 7, the display panel further includes a plurality of third data lines 203 configured to provide third data signals to the pixel circuits 10 of the third pixel units 103; and the first data lines 201, the third data lines 203, and the second data lines 202 are arranged along the first direction D1 intersecting with the extending direction of the first data lines 201.

For example, as illustrated by FIG. 7, the first data line 2010 is configured to provide a first data signal to the pixel circuit 10 of the first pixel unit 101, the second data line 2020 is configured to provide a second data signal to the pixel circuit 10 of the second pixel unit 102, and the third data line 2030 is configured to provide a third data signal to the pixel circuit 10 of the third pixel unit 103. FIG. 7 shows two pixels PX with dashed boxes, i.e., the pixel PX1 and the pixel PX2. The first data line 2010, the second data line 2020, and the third data line 2030 are three data lines of the pixel PX1. A row direction of the pixels is a first direction D1, and a column direction of the pixels is a second direction D2. FIG. 7 shows a first column pixel PX01 and a second column pixel PX02 adjacent to the first column pixel PX01.

For example, as illustrated by FIG. 7, in order to improve the aperture ratio, an orthographic projection of at least one of the first electrode 102a of the second pixel unit 102 and the first electrode 103a of the third pixel unit 103 on the base substrate BS is partially overlapped with the orthographic projection of one of the plurality of third data lines 203 on the base substrate BS.

For example, as illustrated by FIG. 7, in order to balance the aperture ratio and reduce the load, the area of an portion of the first electrode 101a of the first pixel unit 101 overlapped with the second data line 202 is larger than the area of an portion of at least one of the first electrode 102a of the second pixel unit 102 and the first electrode 103a of the third pixel unit 103 overlapped with the third data line 203.

For example, as illustrated by FIG. 7, the orthographic projections of the first electrode 102a of the second pixel unit 102 and the first electrode 103a of the third pixel unit 103 on the base substrate BS are both overlapped with the orthographic projection of the third data line 203 on the base substrate BS. The area of the portion of the first electrode 101a of the first pixel units 101 overlapped with the second data line 202, the area of the portion of the first electrode 102a of the second pixel unit 102 overlapped with the third data line 203, and the area of the portion of the first electrode 103a of the third pixel unit 103 overlapped with the third data line 203 sequentially decrease.

Figure 8:
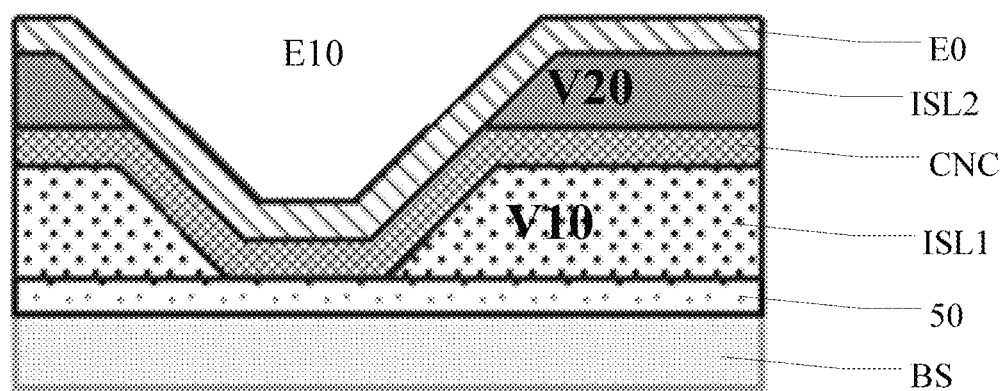
FIG. 8 is a schematic diagram of a first electrode connected to a transistor through a connection element.

FIG. 8 is a schematic diagram of a first electrode connected to a transistor through a connection element. As illustrated by FIG. 8, the first electrode E0 is connected to the connection element CNC through a via hole V20 penetrating through the second insulating layer ISL2; and the connection element CNC is connected to the thin film transistor 50 through a via hole V10 penetrating through the first insulating layer ISL1. A source electrode or a drain electrode of the thin film transistor 50 is connected to the connection element CNC. As illustrated by FIG. 8, an orthographic projection of the via hole V20 on the base substrate BS is at least partially overlapped with an orthographic projection of the via hole V10 on the base substrate BS, so that the via holes are relatively large in depth; and the first electrode E0 has a deep climbing phenomenon at the via holes, which makes the first electrode E0 fall into the deep hole. The recess E10 formed at the via hole V10 or the via hole V20 has a relatively large size, which easily leads to large contact resistance and poor contact, and even causes the first electrode E0 to break and affects the display quality.

Figure 9:
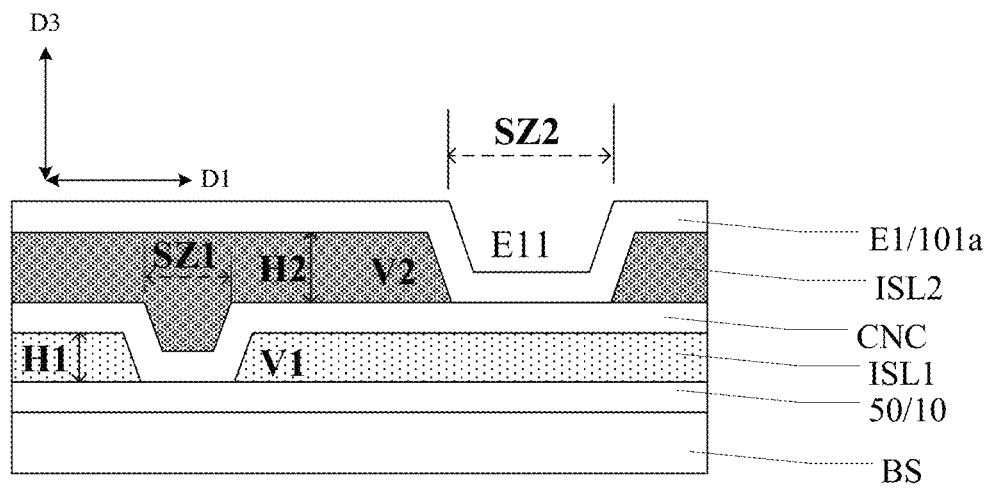
FIG. 9 is a schematic cross-sectional view of a display panel according to an embodiment of the present disclosure.

FIG. 9 is a schematic cross-sectional view of a display panel according to an embodiment of the present disclosure. For example, as illustrated by FIG. 9, the display panel further includes a first insulating layer ISL1, a connection element CNC, and a second insulating layer ISL2, which are arranged in sequence from a position close to the base substrate BS to a position far away from the base substrate BS. The first electrode 101a of the first pixel unit 101 is connected to the pixel circuit 10 through the connection element CNC. The connection element CNC is connected with the pixel circuit 10 through a first via hole V1 penetrating the first insulating layer ISL1, and the first electrode 101a of the first pixel unit 101 is connected with the connection element CNC through a second via hole V2 through the second insulating layer ISL1. An orthographic projection of the first via hole V1 on the base substrate BS is not overlapped with an orthographic projection of the second via V2 on the base substrate BS. As illustrated by FIG. 9, the pixel circuit 10 includes a transistor 50, the first electrode 101a of the first pixel unit 101 is connected to the transistor 50 through the connection element CNC, and the connection element CNC is connected to the transistor 50 through the first via hole V1 penetrating through the first insulating layer ISL1. For example, the transistor 50 includes a source electrode and a drain electrode, and the first electrode 101a of the first pixel unit 101 is connected to the source electrode or the drain electrode of the transistor through the connection element CNC.

In the embodiment of the present disclosure, the orthographic projection of the first via hole V1 on the base substrate BS is not overlapped with the orthographic projection of the second via hole V2 on the base substrate BS, that is, the via hole depth for the first electrode 101a at the connection position with the connection element CNC is reduced by mismatching the two via holes; thus, the climbing depth of the first electrode 101a here is reduced, the recess E11 of the first electrode 101a here is reduced, and the risk of poor contact or even fracture between the first electrode 101a and the connection element CNC is reduced, thereby improving the product yield and being favorable for the electrical connection and improving the display quality.

For example, in the embodiment of the present disclosure, that two element are not overlapped refers to that the two elements are arranged apart from each other; or that orthographic projections of two elements on the base substrate BS are not overlapped refers to that the orthographic projections of the two elements on the base substrate BS are arranged apart from each other. For example, in the embodiments of the present disclosure, that two elements are overlapped refers to that the two elements are partially or totally overlapped with each other; or that orthographic projections of two elements on the base substrate BS are overlapped refers to that the orthographic projections of the two elements on the base substrate BS are partially or totally overlapped with each other.

For example, as illustrated by FIG. 9, a dimension H1 of the first via hole V1 in a direction perpendicular to the base substrate BS is smaller than a dimension H2 of the second via hole V2 in the direction perpendicular to the base substrate BS. For example, as illustrated by FIG. 9, the dimension H1 of the first via hole V1 in the direction perpendicular to the base substrate BS is equal to the thickness of the first insulating layer ISL1, and the dimension H1 of the second via hole V2 in the direction perpendicular to the base substrate BS is equal to the thickness of the second insulating layer ISL2. For example, the thickness of the first insulating layer ISL1 is smaller than that of the second insulating layer ISL2.

For example, as illustrated by FIG. 9, in a cross-sectional view, a maximum dimension SZ1 of the first via hole V1 in a plane parallel to the base substrate BS is smaller than a maximum dimension SZ2 of the second via hole V2 in a plane parallel to the base substrate BS. In a plan view, the first via hole V1 and the second via hole V2 may be circular, and the maximum size is the diameter. In a plan view, in the case where the first via hole V1 and the second via hole V2 are rectangular, the maximum size is the length of the rectangle. In case where the first via hole V1 and the second via hole V2 have other shapes, the maximum size of the first via hole V1 and the second via hole V2 in the plan view is the maximum size in the plane parallel to the substrate BS. For example, as illustrated by FIG. 9, in the cross-sectional view, the dimension of the first via hole V1 in a plane parallel to the base substrate BS is smaller than that of the second via hole V2 in a plane parallel to the base substrate BS. FIG. 9 shows a first direction D1 that is parallel to the base substrate BS and a third direction D3 that is perpendicular to the base substrate BS, the first direction D1 is a direction parallel to the base substrate BS, and the third direction D3 is a direction perpendicular to the base substrate BS. For example, referring to FIGS. 7 and 9, the third direction D3 is perpendicular to the first direction D1 and the second direction D2.

For example, the material of the first insulating layer ISL1 includes an inorganic insulating material, and the material of the second insulating layer ISL2 includes an organic insulating material.

Figure 11:
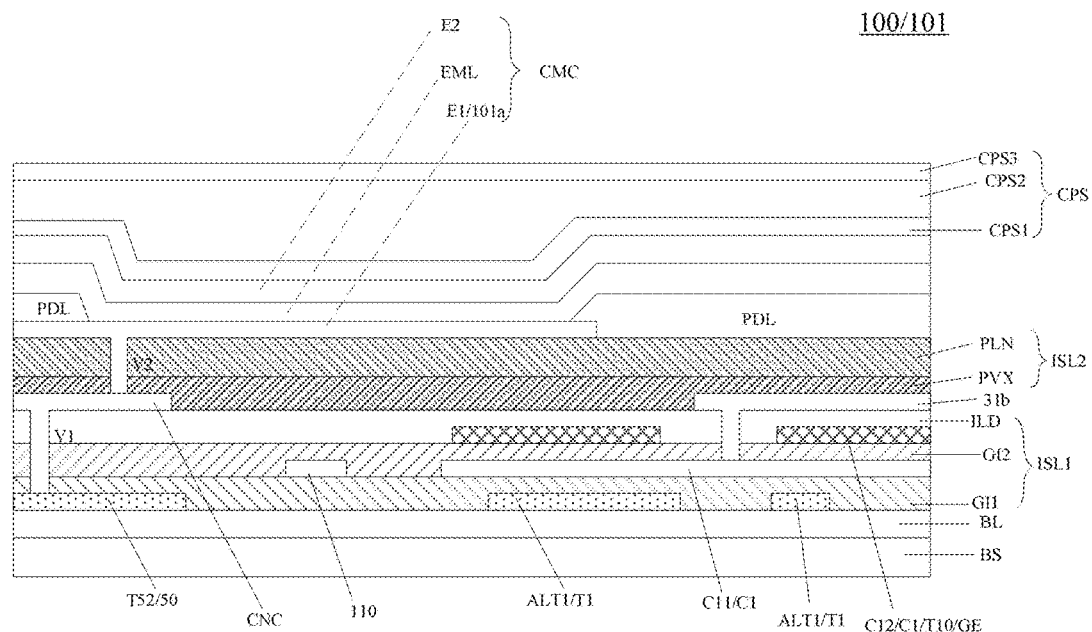
FIG. 11 is a schematic cross-sectional view of a display panel according to an embodiment of the present disclosure.

For example, referring to FIGS. 9 and 11, the first insulating layer ISL1 includes at least one of a first gate insulating layer, a second gate insulating layer, and an interlayer insulating layer, and the second insulating layer ISL2 includes a planarization layer PLN and a passivation layer PVX. For example, the first insulating layer ISL1 is a laminated structure of a plurality of insulating layers. FIG. 11 may be a sectional view along the line MN in FIG. 26.

In FIG. 9, the case where the first electrode E1 serves as the first electrode 101a of the first pixel unit is described as an example, the first electrode 102a of the second pixel unit and the first electrode 103a of the third pixel unit can also adopt such a structure that the first via hole V1 and the second via hole V2 are not overlapped with each other, so as to facilitate electrical connection and improve display quality.

Figure 10:
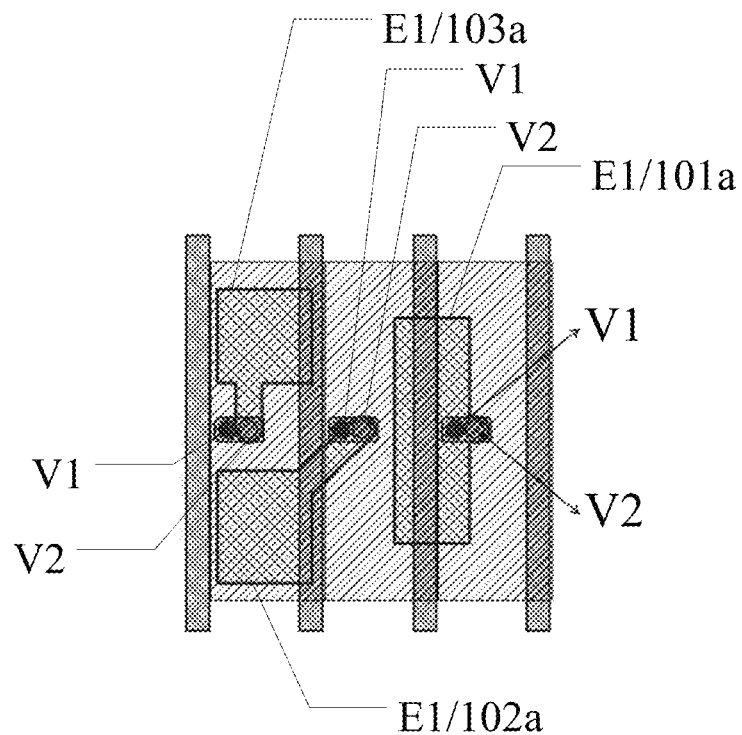
FIG. 10 is a schematic top view of a display panel according to an embodiment of the present disclosure.

FIG. 10 is a schematic top view of a display panel according to an embodiment of the present disclosure. In the display panel shown in FIG. 10, regarding to each of the first electrode 101a of the first pixel unit 101, the first electrode 102a of the second pixel unit 102, and the first electrode 103a of the third pixel unit 103, the orthographic projection of the first via hole V1 on the substrate BS is not overlapped with the orthographic projection of the second via hole V2 on the base substrate BS. That is, both the first electrode 102a of the second pixel unit and the first electrode 103a of the third pixel unit may adopt the structure shown in FIG. 9.

FIG. 11 is a schematic cross-sectional view of a display panel according to an embodiment of the present disclosure. For example, as illustrated by FIG. 11, the display panel includes a thin film transistor 50 (the second light emission control transistor T5 mentioned later) and a storage capacitor C1. The thin film transistor 50 includes a second electrode T52 of a second light emission control transistor T5 located on base substrate BS, an active layer ATL1 of a driving transistor T1, a first gate insulating layer GI1 on a side of second electrode T52 of second light emission control transistor T5 and the active layer ATL1 of the driving transistor T1 away from the base substrate BS, and a gate electrode GE on a side of the first gate insulating layer GI1 away from the base substrate BS. The gate electrode GE is a gate electrode T10 of the driving transistor T1. The gate electrode T10 of the driving transistor T1 has an opening so that a second connection electrode 31b is connected to the first electrode C11 of the storage capacitor C1. The display panel also includes a second gate insulating layer GI2 on a side of the gate electrode GE away from the base substrate BS, an interlayer insulating layer ILD on a side of the second gate insulating layer GI2 away from the base substrate BS, and a connection element CNC and a second connection electrode 31b on a side of the interlayer insulating layer ILD away from the base substrate BS. The connection element CNC is connected to the second electrode T52 through the first via hole V1 penetrating through the first gate insulating layer GI1, the second gate insulating layer GI2, and the interlayer insulating layer ILD; and the second connection electrode 31b is connected to the first electrode C11 of the storage capacitor C1. The storage capacitor C1 includes the first electrode C11 and the second electrode C12; the first electrode C11 and the gate electrode CE are located on the same layer, and are both located in the first conductive pattern layer LY1; the second electrode C12 is located between the second gate insulating layer GI2 and the interlayer insulating layer ILD, and is located in the second conductive pattern layer LY2. The connection element CNC and the second connection electrode 31b are located in the third conductive pattern layer LY3. The display panel also includes a passivation layer PVX and a planarization layer PLN.

As illustrated by FIG. 11, the display panel further includes a light-emitting element EMC, the light-emitting element EMC includes a first electrode E1, a light-emitting functional layer EML, and a second electrode E2. The first electrode E1 is connected with the connection element CNC through a via hole penetrating through the passivation layer PVX and the planarization layer PLN. The display panel also includes an encapsulation layer CPS; the encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode E1 is an anode of the light-emitting element EMC, and the second electrode E2 is a cathode of the light-emitting element EMC, but the present disclosure is not limited thereto.

For example, the light-emitting element EMC includes an organic light-emitting diode. The light-emitting functional layer is located between the second electrode E2 and the first electrode E1. The second electrode E2 is located on a side of the first electrode E1 away from the base substrate BS, and the light-emitting functional layer EML at least includes a light-emitting layer, and may also include at least one of a hole transport layer, a hole injection layer, an electron transport layer, and an electron injection layer.

As illustrated by FIG. 11, the display panel further includes a pixel definition layer PDL. The pixel definition layer PDL has an opening configured to define the light-emitting area (light-emitting area, effective light-emitting area) of the pixel unit. The display panel may further include a spacer (not shown in FIG. 11, refer to the spacer 60 in FIG. 12) configured to support a fine metal mask (FMM) when forming the light-emitting functional layer EML.

For example, a data line is configured to input a data signal to the pixel unit, and a first power supply signal line is configured to input a first power supply voltage to the driving transistor. A second power supply signal line is configured to input a second power supply voltage to the pixel unit. The first power supply voltage is a constant voltage; and the second power supply voltage is a constant voltage, for example, the first power supply voltage is a positive voltage, while the second power supply voltage is a negative voltage; however, the present disclosure is not limited thereto. For example, in some embodiments, the first power supply voltage is a positive voltage and the second power supply signal line is grounded.

Referring to FIGS. 11 and 9, the connection element CNC in FIG. 11 is the connection element CNC shown in FIG. 9, and the thin film transistor 50 in FIG. 11 is the thin film transistor 50 shown in FIG. 9. Therefore, the first electrode E1 is connected to the second electrode T52 of the thin film transistor 50. The first insulating layer ISL1 includes at least one of the first gate insulating layer GI1, the second gate insulating layer GI2, and the interlayer insulating layer ILD; and the second insulating layer ISL2 includes the planarization layer PLN and the passivation layer PVX. For example, in other embodiments, the second insulating layer ISL2 may only include the planarization layer PLN, and the first insulating layer ISL1 may also include other insulating layers.

Through a ball drop test, the ability of the display screen to withstand mechanical impact is tested. It is found that an increase in the size or distribution density of the spacer (Photo Spacer, PS) in OLED products will ameliorate the damage of the product in the drop impact, that is, it will protect the pixels to a certain extent. However, too large size of the PS will not only cause static electricity, but also cause poor display defects such as mura defect due to light blocking.

Figure 12:
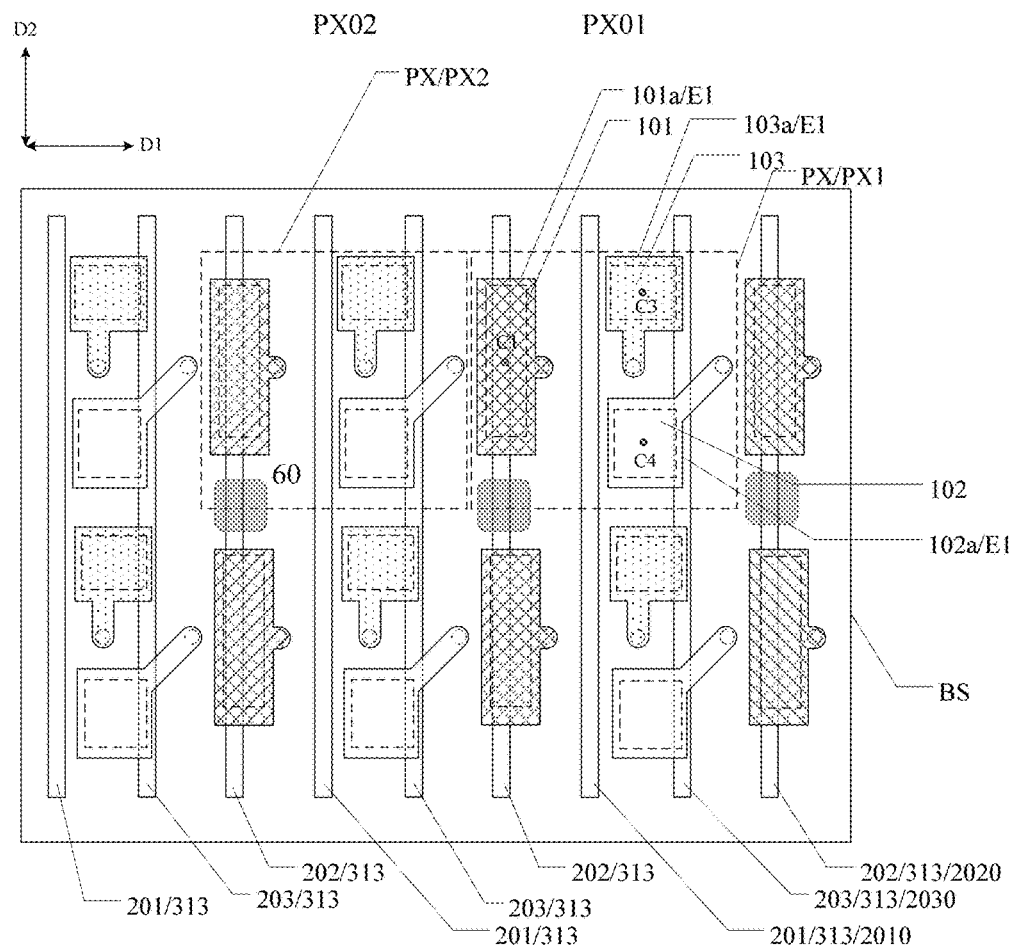
FIG. 12 is a schematic top view of a display panel according to an embodiment of the present disclosure.

FIG. 12 is a schematic top view of a display panel according to an embodiment of the present disclosure. In the display panel shown in FIG. 12, a spacer 60 is provided between the first electrodes 101a of two adjacent first pixel units 101 arranged in the extending direction of the first data lines 201. For example, as illustrated by FIG. 12, the extending direction of the first data lines 201, the extending direction of the second data lines 202, and the extending direction of the third data lines 202 are all the second direction D2.

According to the display panel provided by the embodiment of the present disclosure, the spacer 60 is arranged between the first electrodes 101a of two adjacent first pixel units 101 arranged in the second direction D2, which is beneficial to protecting pixels, reducing static electricity, and reducing poor display defects such as mura defect caused by light blocking.

For example, as illustrated by FIG. 12, in order to balance the supporting and protecting functions and improve display effect, an orthographic projection of the spacer 60 on the base substrate BS is not overlapped with the orthographic projection of the first electrode 101a of the first pixel unit 101 on the base substrate BS.

For example, as illustrated by FIG. 12, the spacer 60 is located in a region surrounded by the first electrodes 101a of two adjacent ones of the first pixel units 101, the first electrodes 102a of two adjacent ones of the second pixel units 102, and the first electrodes 103a of two adjacent ones of the third pixel units 103. For example, in the embodiment of the present disclosure, the first element and the second element are adjacent to each other refer to that no other first element or second element is provided between the first element and the second element. In the case where the first element and the second element are of the same element, no other element is arranged between the two of the same element. For example, other elements different from the first element and the second element may be arranged between the first element and the second element which are adjacent to each other. For example, no first electrode 101a is between two adjacent first electrodes 101a. For example, none of the first electrodes 102a is provided between two adjacent ones of the first electrodes 102a, but the first electrode 101a may be provided between the two adjacent ones of the first electrodes 102a. For example, none of the first electrodes 103a is not provided between two adjacent ones of the first electrodes 103a, but the first electrode 101a may be provided between the two adjacent ones of the first electrodes 103a.

For example, as illustrated by FIG. 12, in order to improve the display effect, no spacer 60 is provided between the first electrode 102a of the second pixel unit 102 and the first electrode 103a of the third pixel unit 103, which are adjacent to each other and arranged in the extending direction (second direction D2) of the first data lines 201. That is, in the display panel shown in FIG. 12, the spacer 60 is provided only between the first electrodes 101a of two adjacent ones of the first pixel units 101 arranged in the extending direction of the first data lines 201.

Some embodiments of the present disclosure will be described below with reference to FIGS. 13 to 26. FIGS. 13 to 26 illustrate a pixel circuit of 7T1C as an example.

Figure 13:
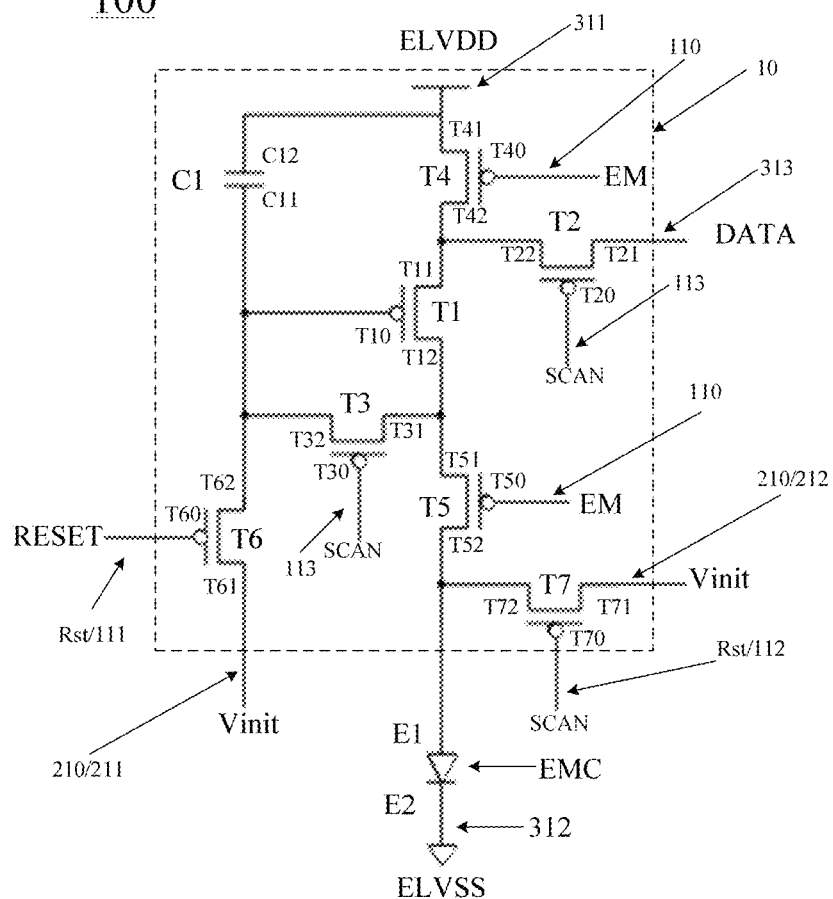
FIG. 13 is a principle diagram of a pixel circuit of a display panel according to an embodiment of the present disclosure.
Figure 14:
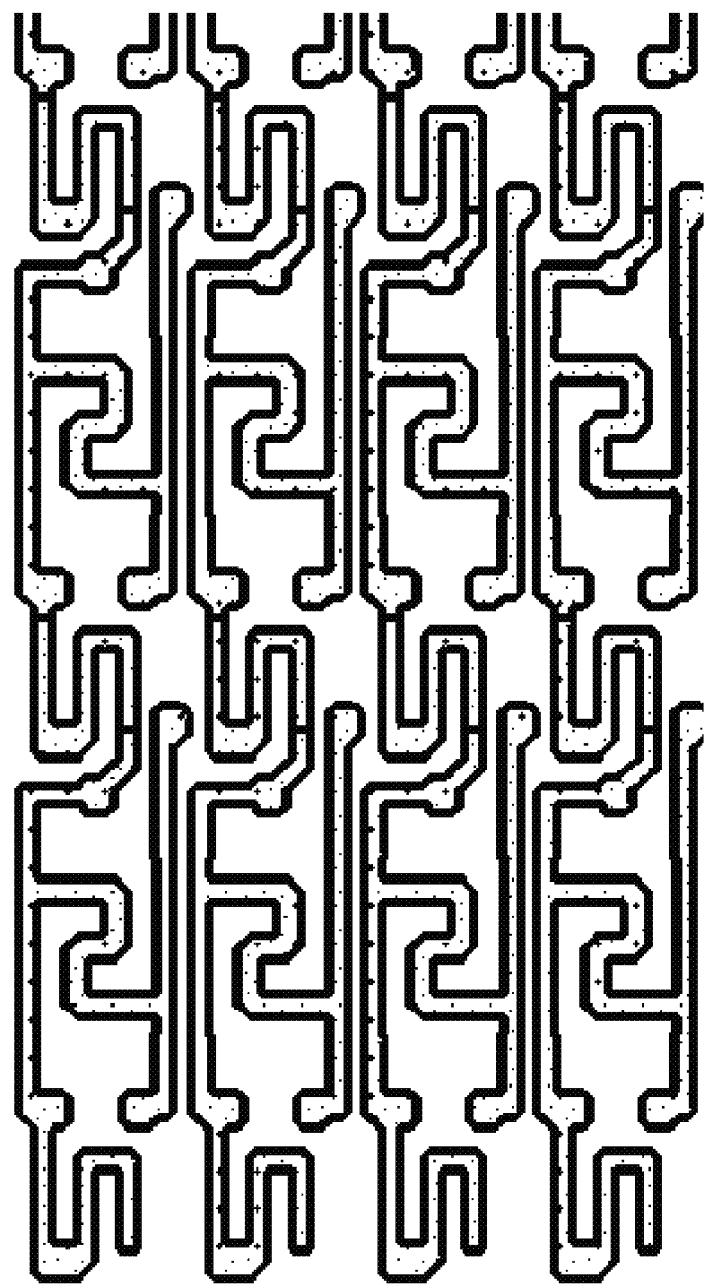
FIG. 14 is a plan view of a semiconductor pattern in a display panel according to an embodiment of the present disclosure.
Figure 15:
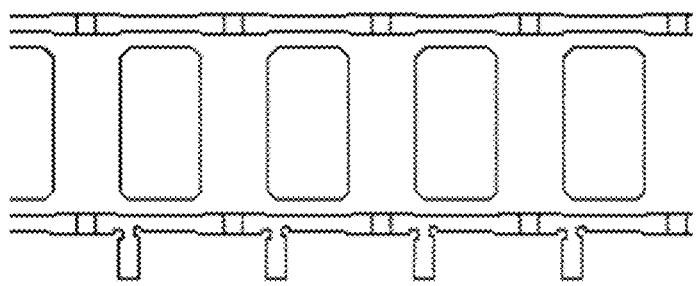
FIG. 15 is a plan view of a first conductive layer in a display panel according to an embodiment of the present disclosure.
Figure 15:
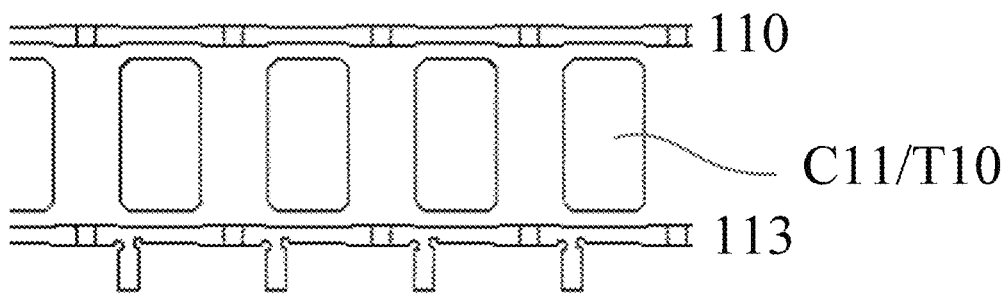
Figure 15:
Figure 16:
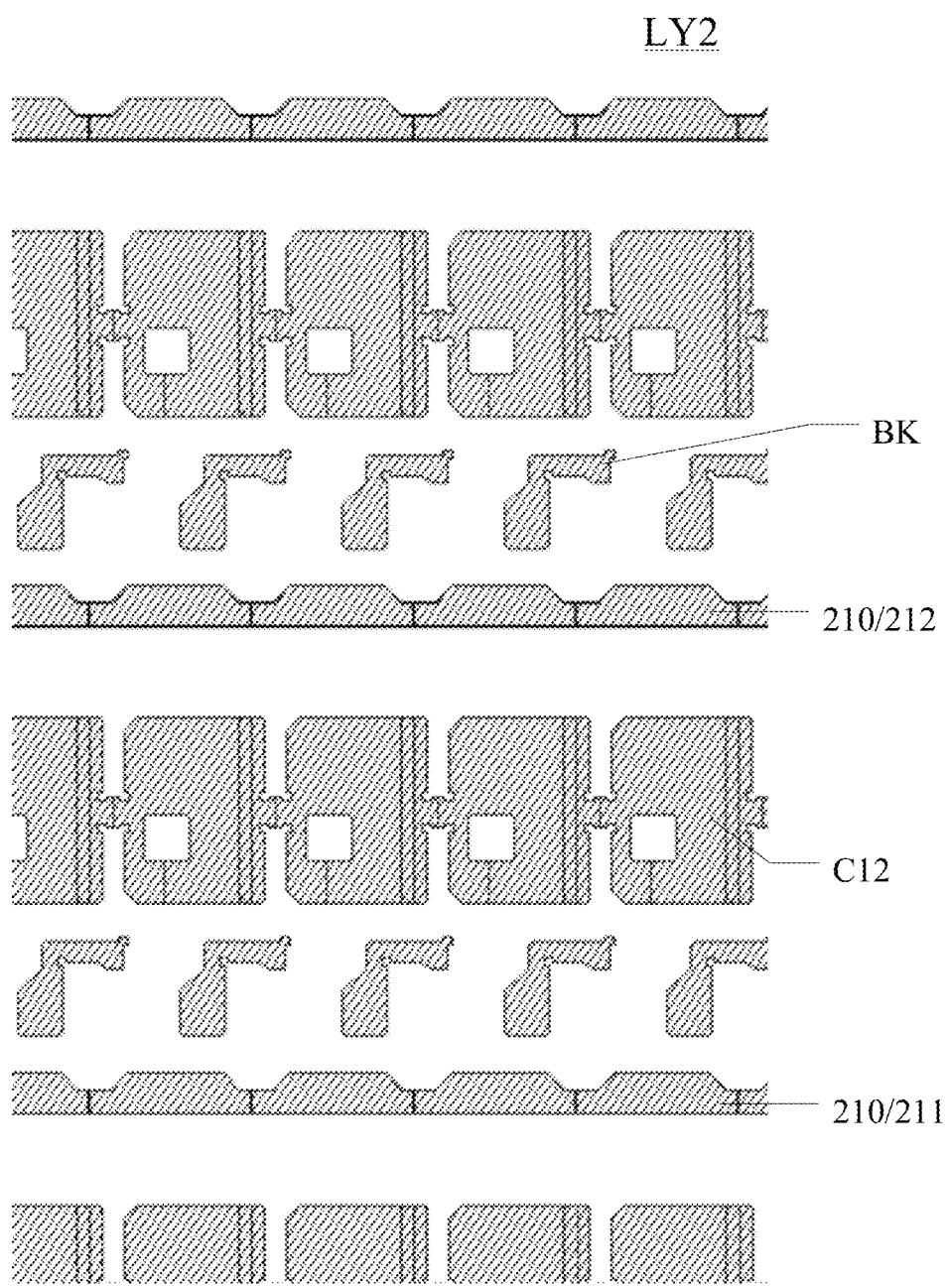
FIG. 16 is a plan view of a second conductive layer in a display panel according to an embodiment of the present disclosure.
Figure 17:
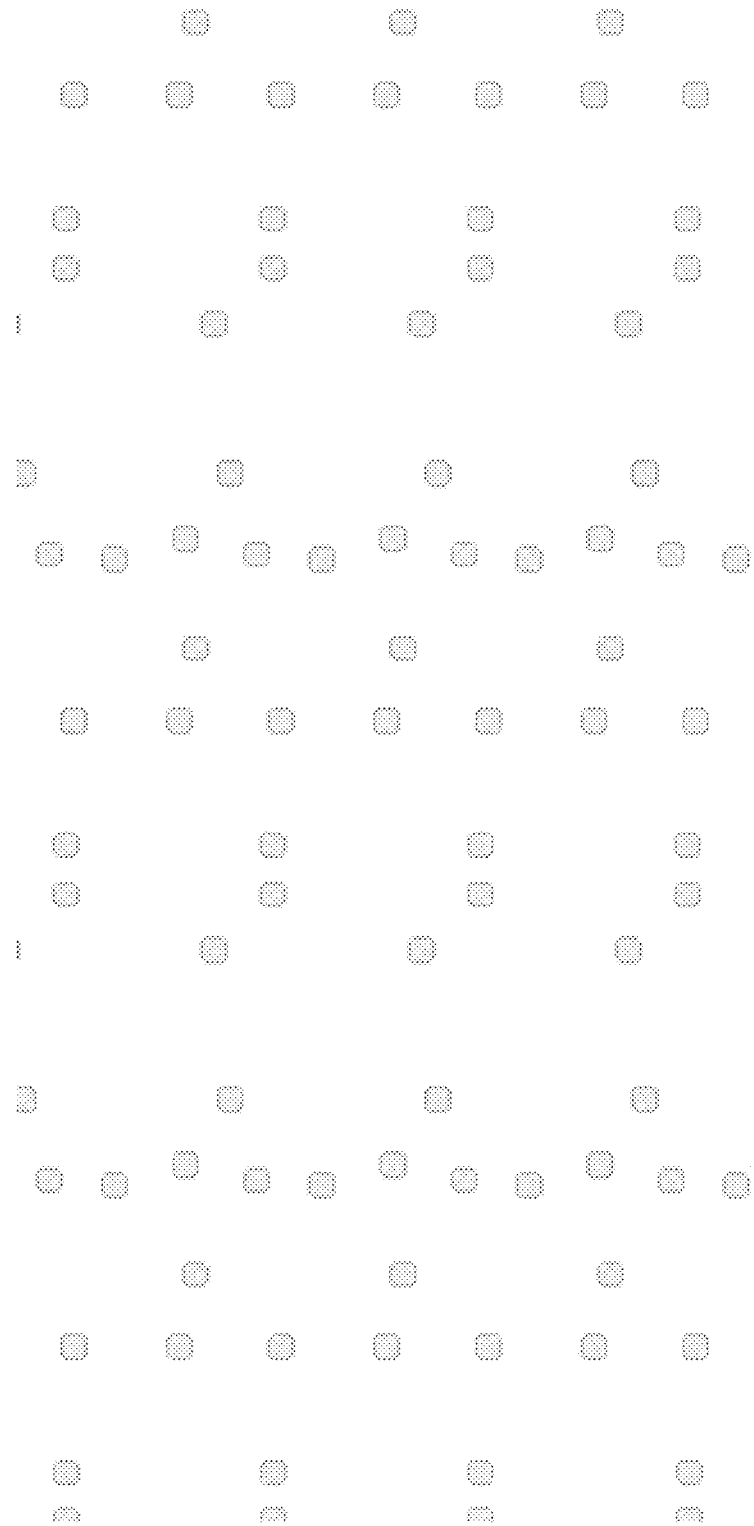
FIG. 17 is a plan view of a first insulating layer in a display panel according to an embodiment of the present disclosure.
Figure 18:
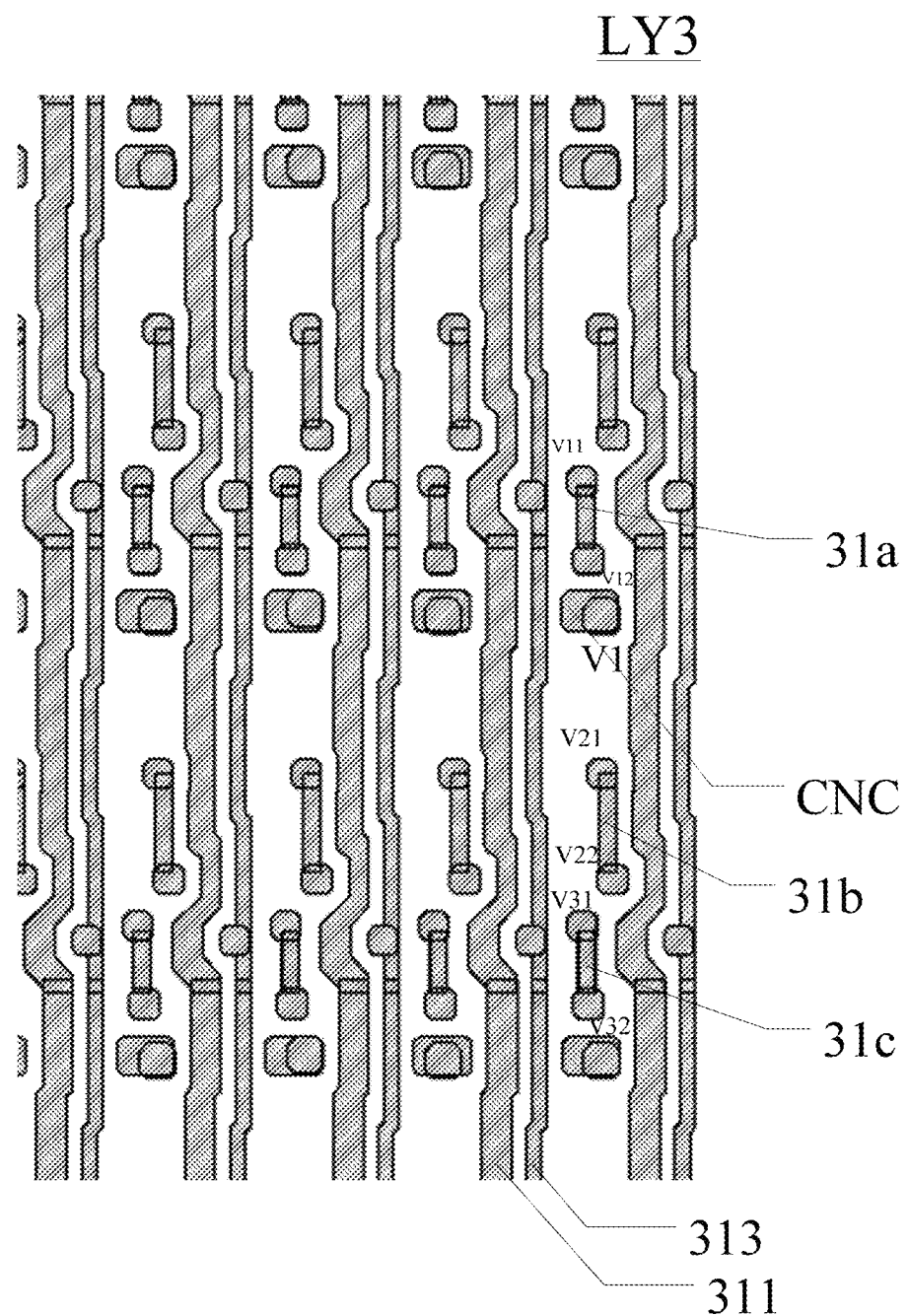
FIG. 18 is a plan view of a third conductive layer in a display panel according to an embodiment of the present disclosure.
Figure 19:
FIG. 19 is a plan view of a second insulating layer in a display panel according to an embodiment of the present disclosure.
Figure 19:
Figure 19:
Figure 20:
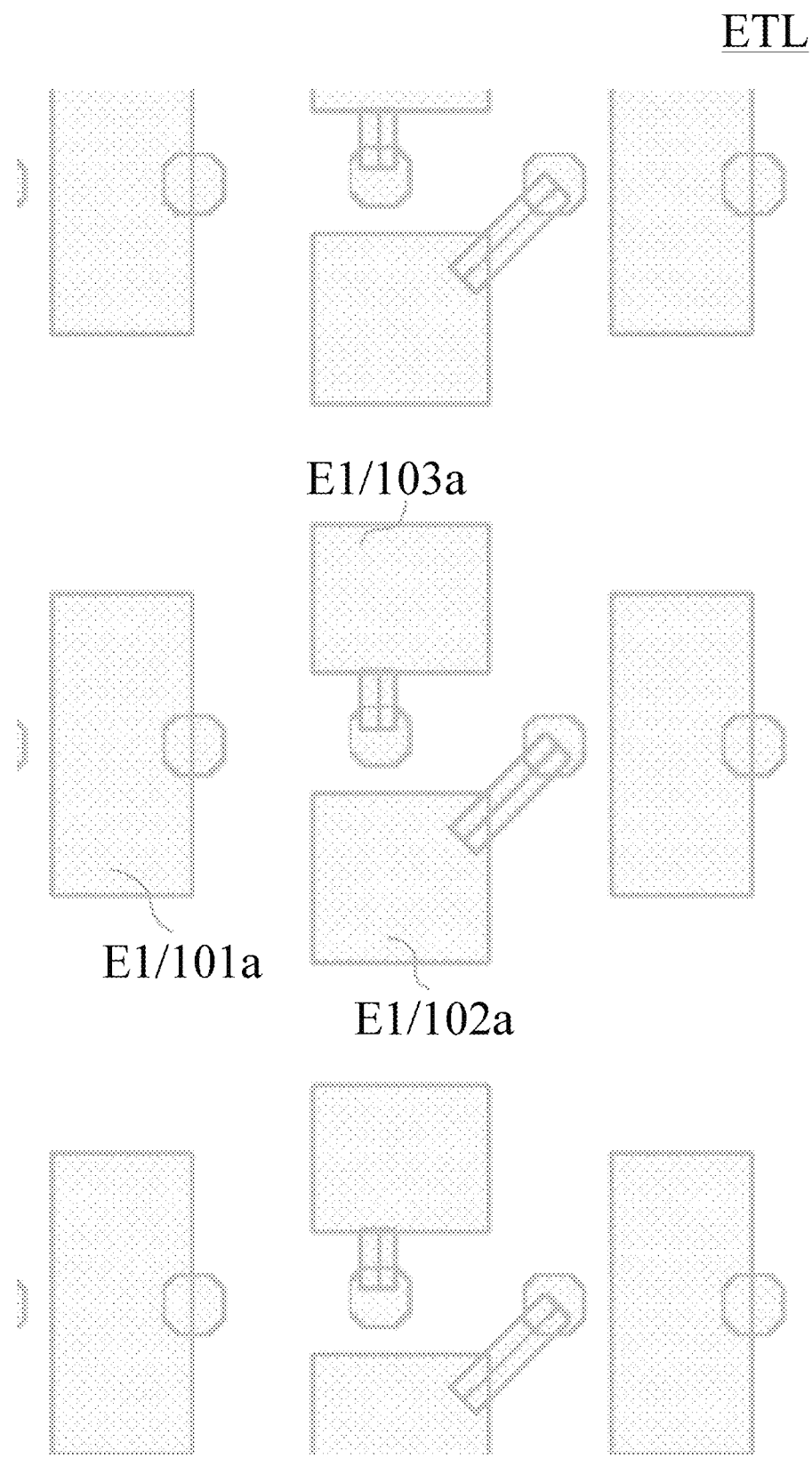
FIG. 20 is a plan view of a first electrode layer in a display panel according to an embodiment of the present disclosure.
Figure 21:
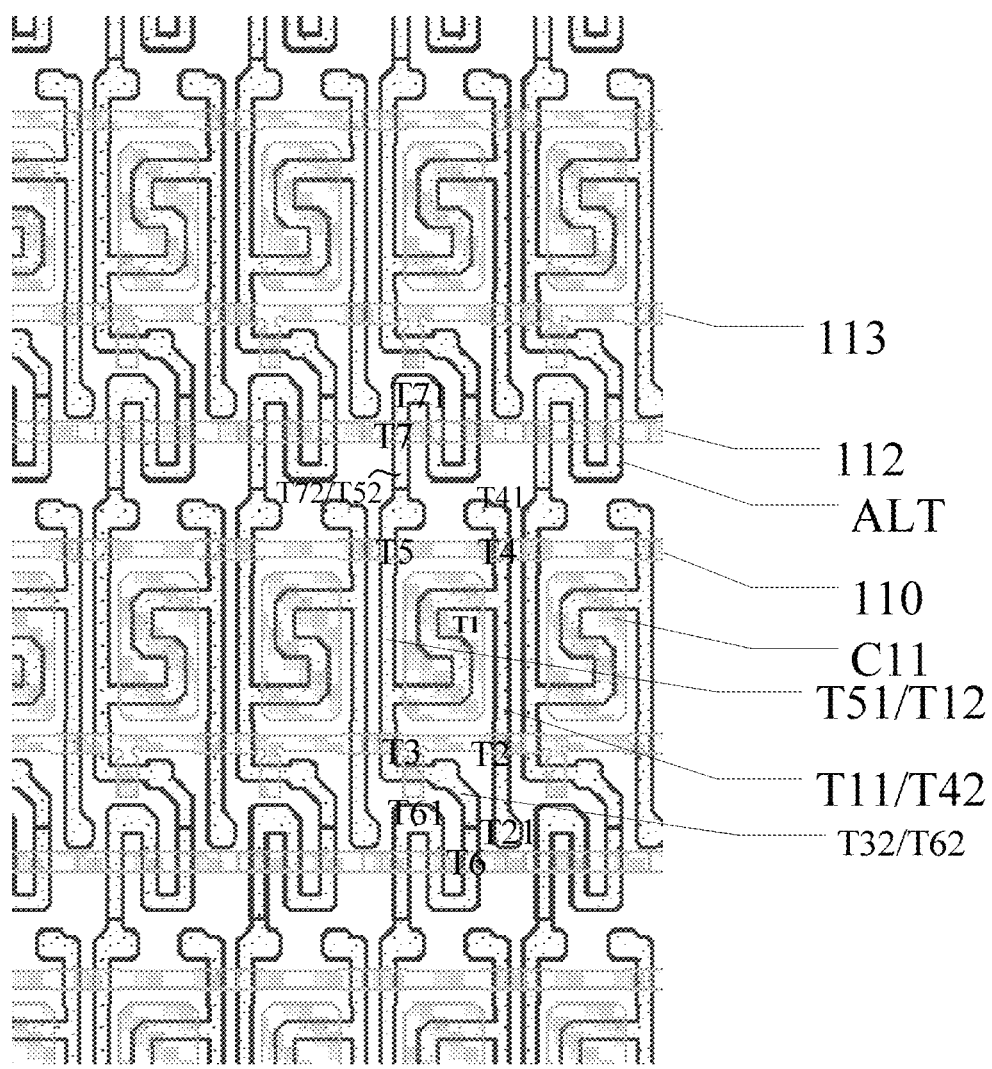
FIG. 21 is a schematic diagram of forming an active layer, a source electrode, and a drain electrode of a thin film transistor in a display panel according to an embodiment of the present disclosure.
Figure 22:
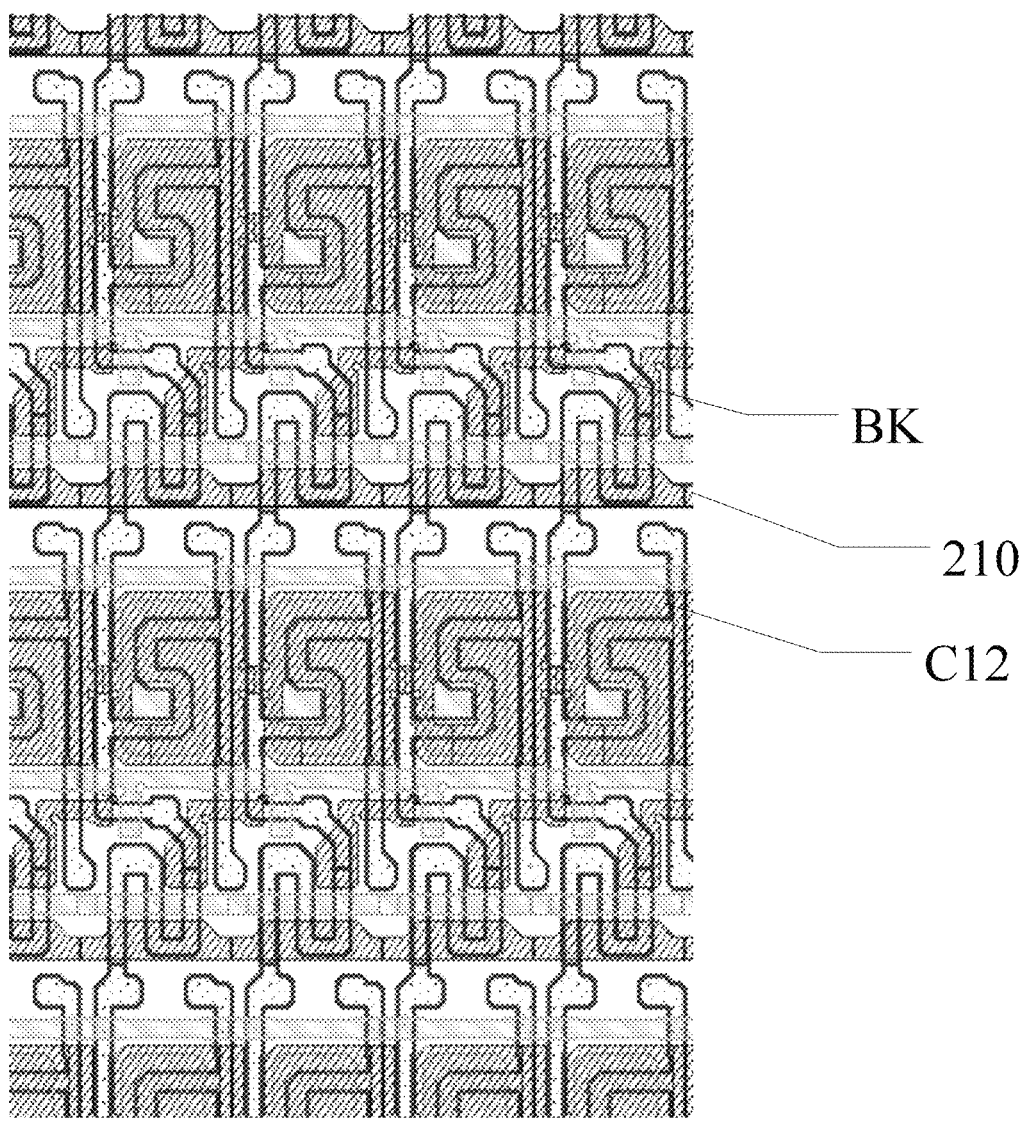
FIG. 22 is a schematic plan view of a display panel with a second conductive layer formed according to an embodiment of the present disclosure.
Figure 23:
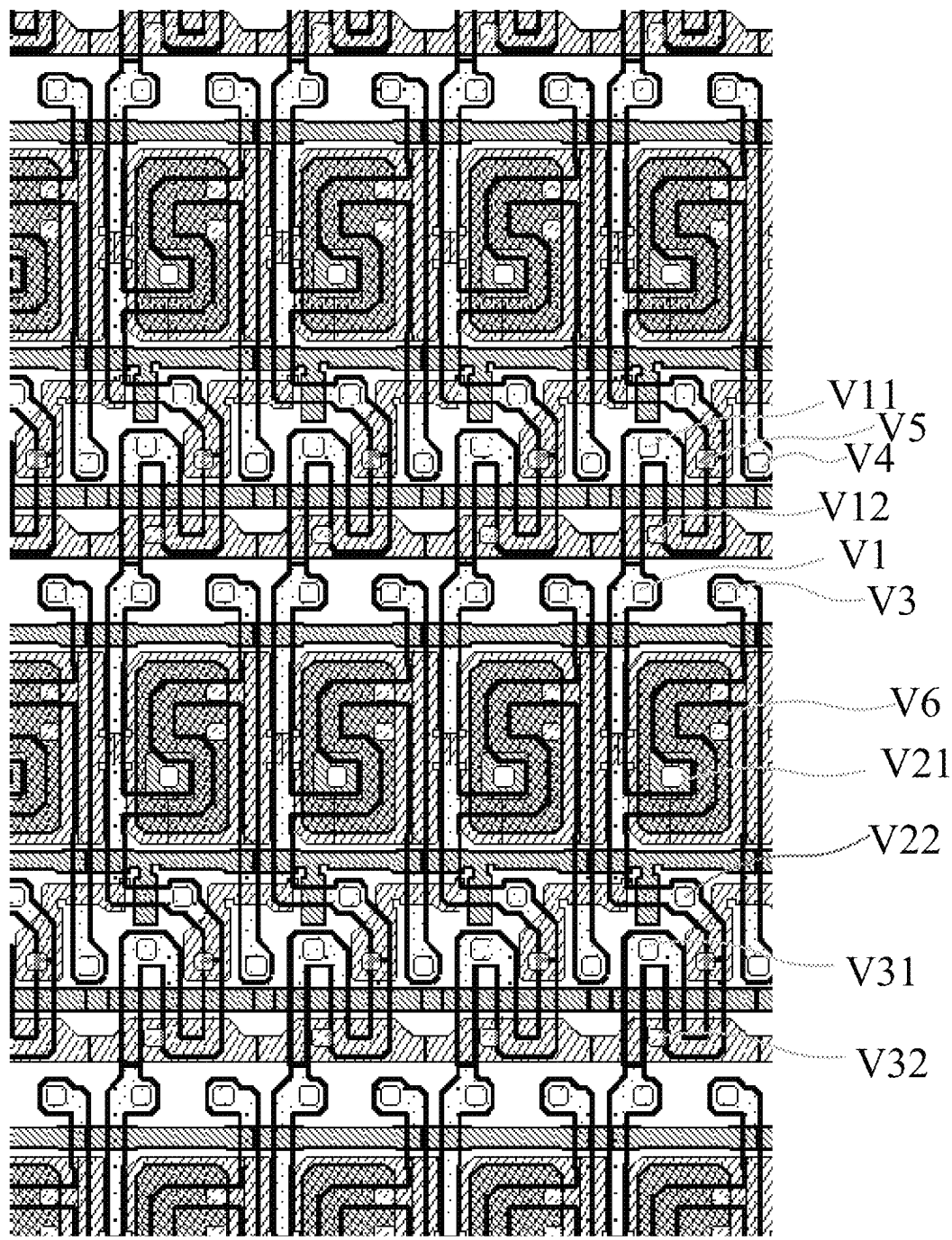
FIG. 23 is a schematic plan view of a display panel with a first insulating layer formed according to an embodiment of the present disclosure.
Figure 24:
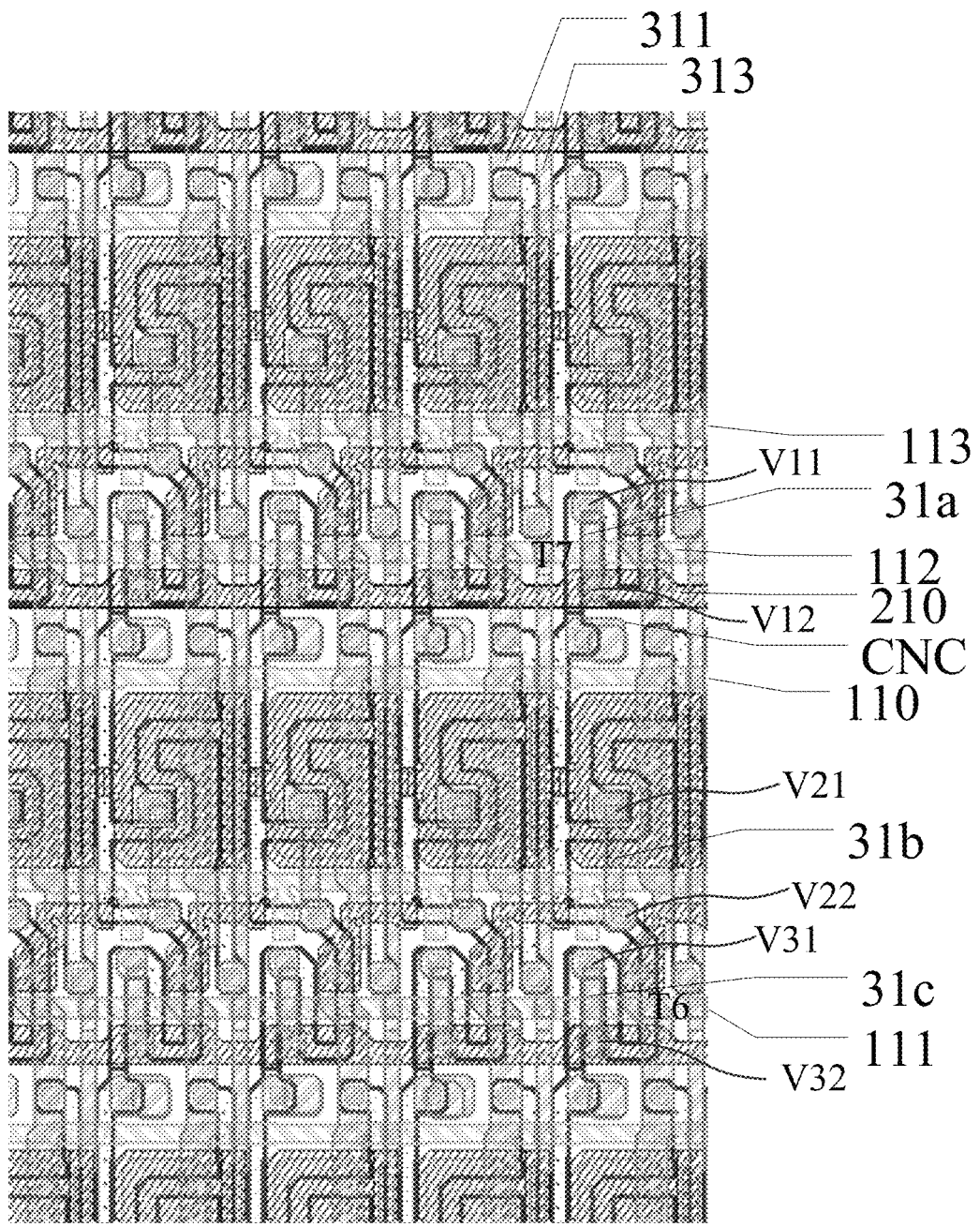
FIG. 24 is a schematic plan view of a display panel with a third conductive layer formed according to an embodiment of the present disclosure.
Figure 25:
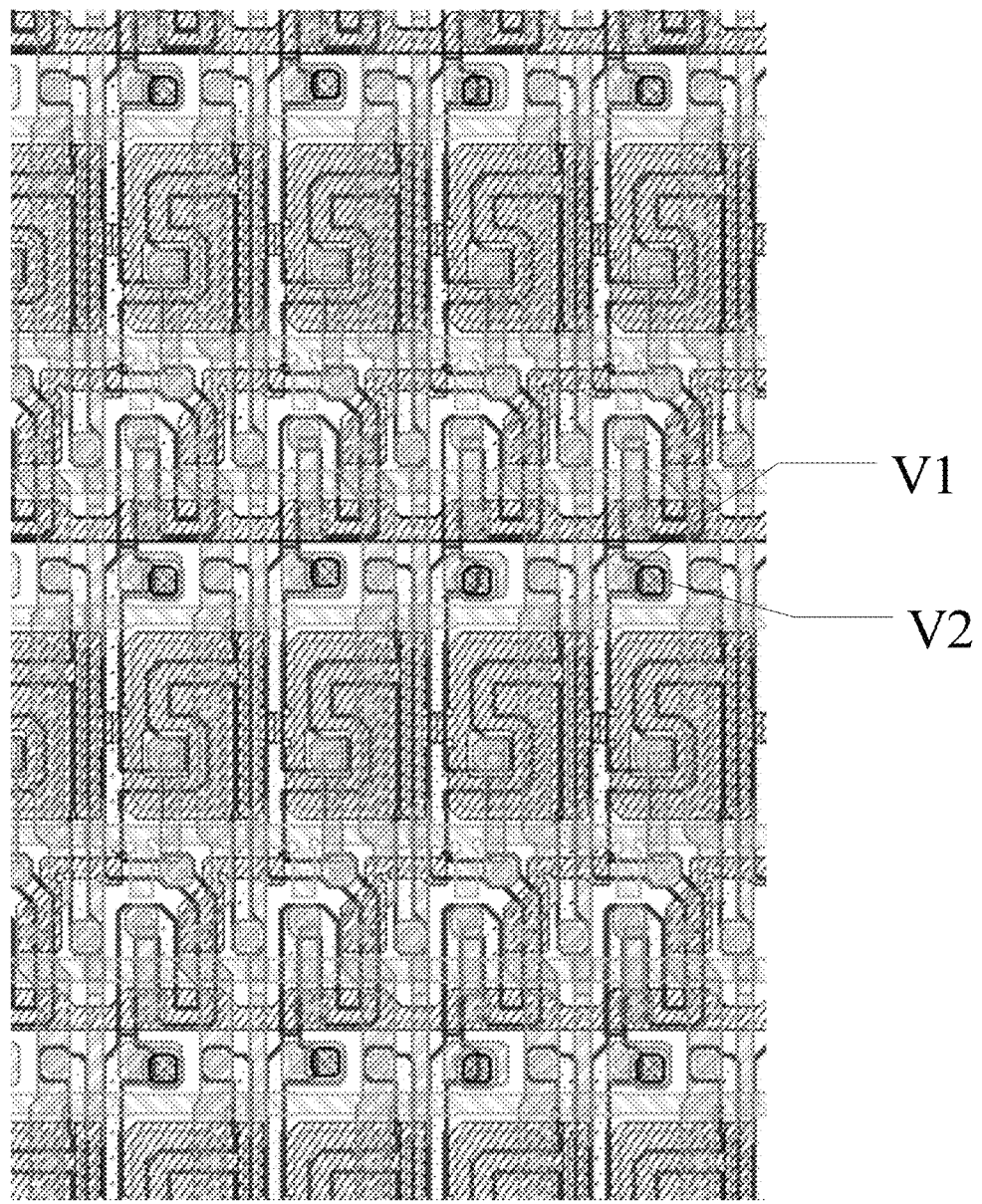
FIG. 25 is a schematic plan view of a display panel with a second insulating layer formed according to an embodiment of the present disclosure.
Figure 26:
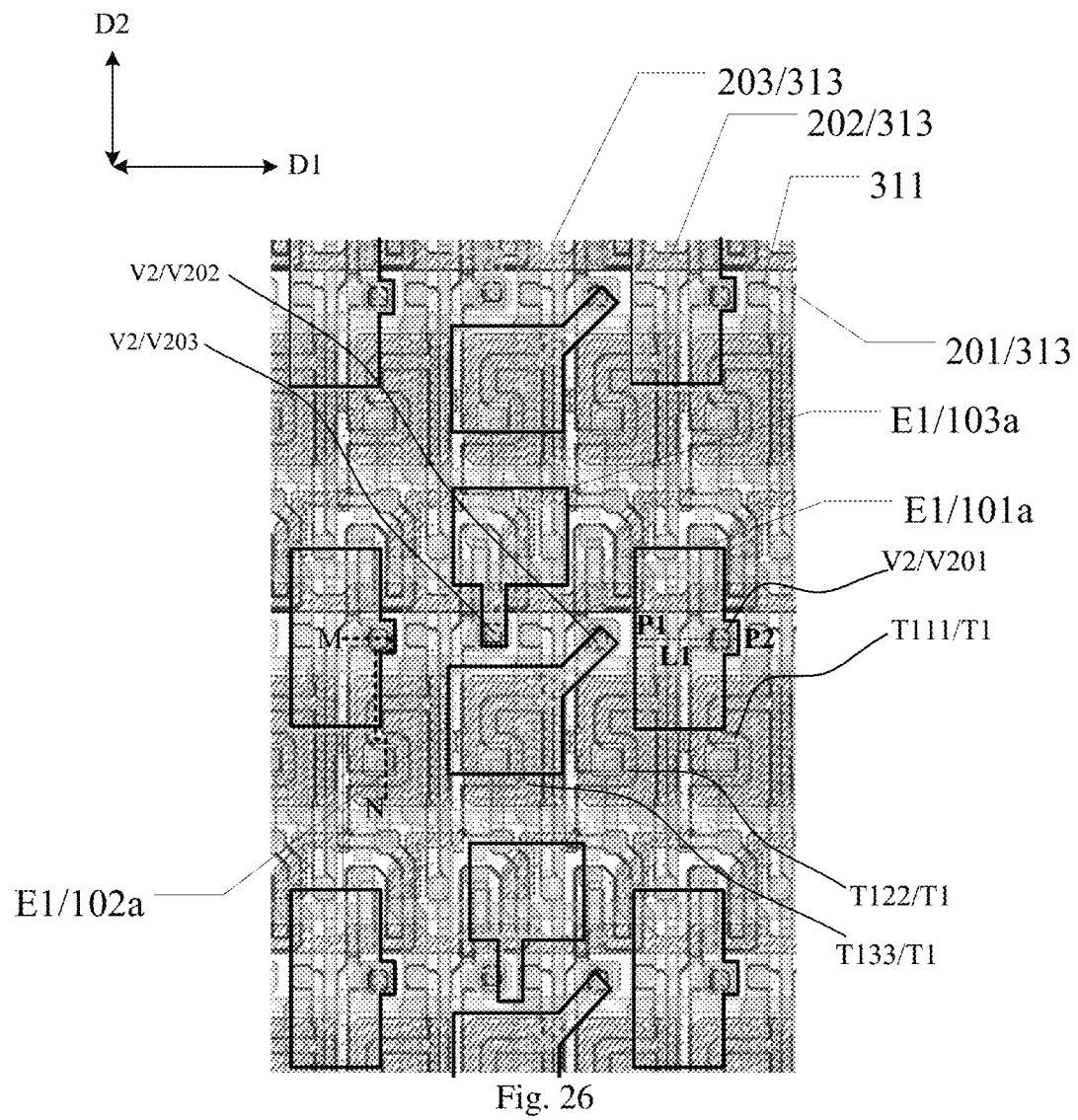
FIG. 26 is a schematic plan view of a display panel with a first electrode layer formed provided by an embodiment of the present disclosure.

FIG. 13 is a principle diagram of a pixel circuit of a display panel according to an embodiment of the present disclosure. FIG. 14 is a plan view of a semiconductor pattern in a display panel according to an embodiment of the present disclosure. FIG. 15 is a plan view of a first conductive layer in a display panel according to an embodiment of the present disclosure. FIG. 16 is a plan view of a second conductive layer in a display panel according to an embodiment of the present disclosure. FIG. 17 is a plan view of a first insulating layer in a display panel according to an embodiment of the present disclosure. FIG. 18 is a plan view of a third conductive layer in a display panel according to an embodiment of the present disclosure. FIG. 19 is a plan view of a second insulating layer in a display panel according to an embodiment of the present disclosure. FIG. 20 is a plan view of a first electrode layer in a display panel according to an embodiment of the present disclosure. FIG. 21 is a schematic diagram of forming an active layer, a source electrode and a drain electrode of a thin film transistor in a display panel according to an embodiment of the present disclosure. FIG. 22 is a schematic plan view of a display panel with a second conductive layer formed according to an embodiment of the present disclosure. FIG. 23 is a schematic plan view of a display panel with a first insulating layer formed according to an embodiment of the present disclosure. FIG. 24 is a schematic plan view of a display panel with a third conductive layer formed according to an embodiment of the present disclosure. FIG. 25 is a schematic plan view of a display panel with a second insulating layer formed according to an embodiment of the present disclosure. FIG. 26 is a schematic plan view of a display panel with a first electrode layer formed provided by an embodiment of the present disclosure. In the embodiment of the present disclosure, for the sake of clarity of illustration, the insulating layer(s) is/are shown in the form of a via hole in the plan view, and the insulating layer itself is shown as being transparent.

For example, referring to FIG. 13, a gate line 113 is configured to supply a scan signal SCAN to the pixel circuit 10. A light emission control signal line 110 is configured to provide a light emission control signal EM to the pixel unit 100. A data line 313 is configured to provide a data signal DATA to the pixel circuit 10; a first power line 311 is configured to provide a constant first voltage signal ELVDD to the pixel circuit 10; and a second power line 312 is configured to provide a constant second voltage signal ELVSS to the pixel circuit 10, the first voltage signal ELVDD being larger than the second voltage signal ELVSS. An initialization signal line 210 is configured to provide an initialization signal Vint to the pixel circuit 10. The initialization signal Vint is a constant voltage signal, and its magnitude can be between the first voltage signal ELVDD and the second voltage signal ELVSS, but the present disclosure is not limited thereto. For example, the initialization signal Vint can be less than or equal to the second voltage signal ELVSS. For example, the initialization signal line 210 includes a first initialization signal line 211 and a second initialization signal line 212. A reset control signal line Rst is configured to provide a reset control signal line RESET to the pixel circuit 10. For example, the reset control signal line Rst includes a first reset control signal line 111 and a second reset control signal line 112. For example, the pixel circuit outputs a driving current to drive the light-emitting element 20 to emit light under the control of signals such as the scan signal SCAN, the data signal DATA, the initialization signal Vint, the first voltage signal ELVDD, the second voltage signal ELVSS, and the light emission control signal EM. The light-emitting element 20 is driven by its corresponding pixel circuit 100 to emit red light, green light, blue light, or white light.

As illustrated by FIG. 13, the pixel circuit 100 includes a driving transistor T1, a data writing transistor T2, a threshold compensation transistor T3, a first light emission control transistor T4, a second light emission control transistor T5, a first reset transistor T6, a second reset transistor T7, and a storage capacitor C1. The driving transistor T1 is electrically connected to the light-emitting element 20, and outputs a driving current to drive the light-emitting element 20 to emit light under the control of the scan signal SCAN, the data signal DATA, the first voltage signal ELVDD, the second voltage signal ELVSS, and other signals. The second light emission control transistor T5 may be the thin film transistor 50 described above.

For example, the display panel provided by the embodiment of the present disclosure further includes a data driving circuit and a scan driving circuit. The data driving circuit is configured to provide the data signal data to the pixel unit 100 according to an instruction of an control circuit; the scan driving circuit is configured to provide the light emission control signal EM, the scan signal SCAN, the reset control signal RESET, and other signals to the pixel unit 100 according to the instruction of the control circuit. For example, the control circuit includes an external integrated circuit (IC), but is not limited thereto. For example, the scan driving circuit is a GOA (Gate driver On Array) structure mounted on the display panel, or a driver chip (IC) structure bonded with the display panel. For example, different driving circuits may also be used to provide the light emission control signal EM and the scan signal SCAN, respectively. For example, the display panel further includes a power source (not shown in the figure) to provide the abovementioned voltage signals, which can be a voltage source or a current source as required; and the power source is configured to provide the first voltage signal ELVDD, the second power supply voltage ELVSS, the initialization signal Vint, and the like to the pixel unit 100 through the first power line 311, the second power line 312, and the initialization signal line 210, respectively.

As illustrated by FIG. 13, a second electrode C12 of the storage capacitor C1 is electrically connected to the first power line 311, and a first electrode C11 of the storage capacitor C1 is electrically connected to a second electrode T32 of the threshold compensation transistor T3. A gate electrode T20 of the data writing transistor T2 is electrically connected to the gate line 113, and a first electrode T21 and a second electrode T22 of the data writing transistor T2 are electrically connected to the data line 313 and a first electrode T11 of the driving transistor T1, respectively. A gate electrode T30 of the threshold compensation transistor T3 is electrically connected to the gate line 113, a first electrode T31 of the threshold compensation transistor T3 is electrically connected to a second electrode T12 of the driving transistor T1, and a second electrode T32 of the threshold compensation transistor T3 is electrically connected to the gate electrode T10 of the driving transistor T1.

For example, as illustrated by FIG. 13, a gate electrode T40 of the first light emission control transistor T4 and a gate electrode T50 of the second light emission control transistor T5 are both connected to the light emission control signal line 110.

For example, as illustrated by FIG. 13, a first electrode T41 and a second electrode T42 of the first light emission control transistor T4 are electrically connected to the first power line 311 and the first electrode T11 of the driving transistor T1, respectively. The first electrode T51 and the second electrode T52 of the second light emission control transistor T5 are electrically connected to the second electrode T12 of the driving transistor T1 and the first electrode E1 of the light-emitting element 20, respectively. A second electrode E2 of the light-emitting element 20 (which may be a second electrode of an OLED, such as a cathode) is electrically connected to the second power line 312.

For example, as illustrated by FIG. 13, a gate electrode T60 of the first reset transistor T6 is electrically connected to the first reset control signal line 111, a first electrode T61 of the first reset transistor T6 is electrically connected to the first initialization signal line 211, and a second electrode T62 of the first reset transistor T6 is electrically connected to the gate electrode T10 of the driving transistor T1. A gate electrode T70 of the second reset transistor T7 is electrically connected to the second reset control signal line 112, the first electrode T71 of the second reset transistor T7 is electrically connected to the second initialization signal line 212, and the second electrode T72 of the second reset transistor T7 is electrically connected to the first electrode E1 of the light-emitting element EMC.

FIG. 14 shows a semiconductor pattern SCP, and FIG. 15 shows a first conductive layer LY1. For example, a first gate insulating layer is disposed between the first conductive layer LY1 and the semiconductor pattern SCP. The first conductive layer LY1 is used as a mask to dope the semiconductor pattern SCP, so that the region covered by the first conductive layer LY1 retains semiconductor characteristics and forms an active layer, while the region not covered by the first conductive layer LY1 of the semiconductor pattern SCP is conductive to form the source electrodes and drain electrodes of the thin film transistors. The active layer ALT formed after part of the semiconductor pattern SCP is formed into conductor is shown by FIG. 21.

As illustrated by FIG. 15, the first conductive layer LY1 includes a first reset control signal line 111, a second reset control signal line 112, a light emission control signal line 110, a gate line 113, and a first electrode C11 of the storage capacitor C1.

FIG. 16 shows the second conductive layer LY2. For example, a second gate insulating layer is disposed between the second conductive layer LY2 and the first conductive layer LY1. The second conductive layer LY2 includes a blocker BK, the first initialization signal line 211, the second initialization signal line 212, and the second electrode C12 of the storage capacitor C1. The blocker BK can be connected with the first power line 311 to provide a constant voltage. The blocker BK is configured to shield the conductive portion between the two channels of the threshold compensation transistor T3, and the blocker BK and the conductive portion form a capacitor to prevent the threshold compensation transistor T3 from generating leakage current and affecting the display effect.

FIG. 17 shows a pattern of the first insulating layer ISL1. The dots in the figure are the via holes in the first insulating layer ISL1. The first insulating layer ISL1 includes at least one of the first gate insulating layer, the second gate insulating layer, and the interlayer insulating layer. The interlayer insulating layer is located between the second conductive layer LY2 and the third conductive layer LY3. Description regarding to the first gate insulating layer, the second gate insulating layer, the interlayer insulating layer, the first conductive layer LY1, the second conductive layer LY2, and the third conductive layer LY3 can refer to FIG. 11. FIG. 22 shows a schematic plan view after forming the second conductive layer LY2.

FIG. 18 shows a third conductive layer LY3; the third conductive layer LY3 includes a connection element CNC, a first connection electrode 31a, a second connection electrode 31b, and a third connection electrode 31c.

For example, as illustrated by FIG. 18, the first connection electrode 31a, the second connection electrode 31b, the third connection electrode 31c, the connection element CNC, the data line 313, and the first power line 311 are located in the same layer.

Referring to FIGS. 18, 21, 23 and 24, the data line 313 is electrically connected with the first electrode T21 of the data writing transistor T2 through a via hole V4, the first power line 311 is electrically connected with the first electrode T41 of the first light emission control transistor T4 through a via hole V3; the first power line 311 is electrically connected with the second electrode C12 of the storage capacitor C1 through a via hole V6, and the first power line 311 is electrically connected with the conductive blocker BK through a via hole V5. One end of the first connection electrode 31a is electrically connected with the second initialization signal line 212 through a via hole V12, and the other end of the first connection electrode 31a is electrically connected with the first electrode T71 of the second reset transistor T7 through the via hole V11, so that the first electrode T71 of the second reset transistor T7 is electrically connected to the second initialization signal line 212. One end of the third connection electrode 31c is electrically connected with the first initialization signal line 211 through a via hole V32, and the other end of the third connection electrode 31c is electrically connected with the first electrode T61 of the first reset transistor T6 through a via hole V31, so that the first electrode T61 of the first reset transistor T6 is electrically connected to the first initialization signal line 211. One end of the second connection electrode 31b is electrically connected with the second electrode T62 of the first reset transistor T6 through a via hole V22, and the other end of the second connection electrode 31b is electrically connected with the gate electrode T10 of the driving transistor T1 (i.e., the first electrode C11 of the storage capacitor C1) through a via hole V21, so that the second electrode T62 of the first reset transistor T6 is electrically connected with the gate electrode T10 of the driving transistor T1 (i.e., the first electrode C11 of the storage capacitor C1). The connection element CNC is electrically connected to the second electrode T52 of the second light emission control transistor T5 through a first via hole V1. The connection element CNC can be used to electrically connect with the first electrode E1 to be subsequently formed (refer to FIG. 13) of light-emitting element EMC.

FIG. 19 shows the second insulating layer ISL2, and the dots in FIG. 19 are via holes in the second insulating layer ISL2. FIG. 19 shows a second via hole V2. The second via hole V2 includes a second via hole V201, a second via hole V202 and a second via hole V203.

FIG. 20 shows the electrode layer ETL. The electrode layer ETL includes the first electrode 101a of the first pixel unit 101, the first electrode 102a of the second pixel unit 102, and the first electrode 103a of the third pixel unit 103. The first electrode 101a of the first pixel unit 101 is connected with the corresponding connection element CNC through a via hole V201, the first electrode 102a of the second pixel unit 102 is connected with the corresponding connection element CNC through a via hole V202, and the first electrode 103a of the third pixel unit 103 is connected with the corresponding connection element CNC through a via hole V203. Referring to FIG. 25, in each of the three pixel units, an orthographic projection of the second via hole V2 on the base substrate is not overlapped with an orthographic projection of the first via hole V1 on the base substrate. FIG. 26 shows a schematic plan view after the first electrode layer is formed.

It should be noted that the transistors adopted in one embodiment of the present disclosure can be thin film transistors, field effect transistors or other switching devices with the same characteristics. The source electrode and the drain electrode of the transistor used here can be symmetrical in structure, so there can be no difference in structure between the source electrodes and drain electrodes. In an embodiment of the present disclosure, in order to distinguish the two electrodes of the transistor except the gate electrode, it is directly described that one electrode is the first electrode and the other electrode is the second electrode, so the first electrode and the second electrode of all or part of the transistors in the embodiment of the present disclosure can be interchanged as required. For example, the first electrode of the transistor described in the embodiment of the present disclosure may be a source electrode and the second electrode may be a drain electrode. Or, the first electrode of the transistor is the drain electrode and the second electrode is the source electrode.

In addition, transistors can be divided into N-type and P-type transistors according to their characteristics. The embodiment of the present disclosure takes the p-type transistors as an example. Based on the description and teaching of this implementation in this disclosure, people of ordinary skill in the field can easily think of an implementation in which at least some transistors in the pixel circuit of the embodiment of this disclosure are N-type transistors, that is, N-type transistors or a combination of N-type transistors and P-type transistors, so these implementations are also within the protection scope of this disclosure.

FIGS. 13 to 26 illustrate a pixel circuit of 7T1C as an example, and embodiments of the present disclosure include but are not limited thereto. It should be noted that the embodiments of the present disclosure do not limit the number of thin film transistors and the number of capacitors included in the pixel circuit. For example, in other embodiments, the pixel circuit of the display substrate may also be a structure including other numbers of transistors, such as 7T2C structure, 6T1C structure, 6T2C structure or 9T2C structure, which is not limited by the embodiments of the present disclosure.

As illustrated by FIGS. 20 and 26, the first electrode 101a of the first pixel unit 101, the first electrode 102a of the second pixel unit 102, and the first electrode 103a of the third pixel unit 103 are spaced apart from each other. As illustrated by FIG. 26, the orthographic projection of the first data line 201 on the base substrate BS is not overlapped with the orthographic projection of any one of the first electrode 101a of the first pixel unit 101, the first electrode 102a of the second pixel unit 102 and the first electrode 103a of the third pixel unit 103 on the base substrate BS.

For example, as illustrated by FIG. 26, in order to facilitate understanding, a driving transistor T111 of the first pixel unit 101, a driving transistor T122 of the second pixel unit 102, and a driving transistor T133 of the third pixel unit 103 are shown in FIG. 26. All of the driving transistor T111, the driving transistor T122, and the driving transistor T133 are the driving transistors T1 described above.

In order to facilitate the pixel layout and improve the display effect, the embodiments of the present disclosure provide a suitable location design for the first electrodes of the pixel units and the driving transistors. For example, as illustrated by FIG. 26, the first electrode 103a of the third pixel unit 103 is not overlapped with the driving transistors T1. As illustrated by FIG. 26, the first electrode 103a of the third pixel unit 103 is not overlapped with any one of the driving transistor T111 of the first pixel unit 101, the driving transistor T122 of the second pixel unit 102 and the driving transistor T133 of the third pixel unit 103. As illustrated by FIG. 26, the first electrode 102a of the second pixel unit 102 is not overlapped with the driving transistor T122 of the second pixel unit 102, but is overlapped with the driving transistor T133 of the third pixel unit 103. As illustrated by FIG. 26, the first electrode 101a of the first pixel unit 101 is partially overlapped with the driving transistor T122 of the second pixel unit 102 and is partially overlapped with the driving transistor T111 of the first pixel unit 101. As illustrated by FIG. 26, the driving transistor T133 of the third pixel unit 103, the driving transistor T122 of the second pixel unit 102, and the driving transistor T111 of the first pixel unit 101 are sequentially arranged in the first direction D1.

For example, it can also be described in the way of orthographic projections; that is, as illustrated by FIG. 26, the orthographic projection of the first electrode 103a of the third pixel unit 103 on the base substrate is not overlapped with the orthographic projections of the driving transistors T1 on the base substrate. That is, the orthographic projection of the first electrode 103a of the third pixel unit 103 on the base substrate is not overlapped with any one of the orthographic projection of the driving transistor T111 of the first pixel unit 101, the driving transistor T122 of the second pixel unit 102 and the driving transistor T133 of the third pixel unit 103. As illustrated by FIG. 26, the orthographic projection of the first electrode 102a of the second pixel unit 102 on the base substrate is not overlapped with the orthographic projection of the driving transistor T122 of the second pixel unit 102, but is overlapped with the orthographic projection of the driving transistor T133 of the third pixel unit 103. As illustrated by FIG. 26, the orthographic projection of the first electrode 101a of the first pixel unit 101 on the base substrate is partially overlapped with the orthographic projection of the driving transistor T122 of the second pixel unit 102 on the base substrate, and is partially overlapped with the orthographic projection of the driving transistor T111 of the first pixel unit 101 on the base substrate.

For example, as illustrated by FIG. 26, with regard to the first pixel unit 101, the orthographic projection of a connection line L1 of midpoints P1 and P2 of two opposite sides extending along the second direction D2 of the first pixel unit 101 on the base substrate passes through the orthographic projection of the second via hole V2 on the base substrate; and the second via hole V2 is located at an edge of the first electrode 101a. For example, the second via hole V2 of the first pixel unit 101 is near the midpoint of an long edge of the first electrode 101a.

For example, as illustrated by FIG. 26, with regard to the first pixel unit 101, the second pixel unit 102 and the third pixel unit 103, the second via holes V2 are identified as V201, V202 and V203, respectively. The second via hole V203 of the third pixel unit 103, the second via hole V202 of the second pixel unit 102, and the second via hole V201 of the first pixel unit 101 are sequentially arranged in the first direction DE As illustrated by FIG. 26, in order to facilitate the fabrication of the first electrode and improve the display effect, the distance between the second via hole V203 of the third pixel unit 103 and the first electrode 101a of the first pixel unit 101 closest to the second via hole V203 is greater than or equal to 3.5 microns; and the distance between the second via hole V203 of the third pixel unit 103 and the first electrode 102a of the second pixel unit 102 closest to the second via hole V203 is greater than or equal to 3.5 microns. For example, in order to facilitate the fabrication of the first electrode and improve the display effect, the distance between the second via hole V202 of the second pixel unit 102 and the first electrode 101a of the first pixel unit 101 closest to the second via V202 is greater than or equal to 3.5 microns; and the distance between the second via hole V202 of the second pixel unit 102 and the first electrode 103a of the third pixel unit 103 closest to the second via hole V203 is greater than or equal to 3.5 microns.

For example, in some embodiments of the present disclosure, the second light emission control transistor T5 is referred to as a first transistor, and the driving transistor T1 is referred to as a second transistor.

To sum up, in the display panel provided by the embodiment of the present disclosure, under the condition of adopting a novel Real RGB pixel arrangement, the design scheme for improving screen performance by arranging at least one of a first electrode, a via hole of a second insulating layer and a spacer (PS) can reduce the load of the first pixel unit, thereby reducing the working voltage difference and power consumption of the first pixel unit, preventing the first electrode from being broken at the deep hole climbing position and other defects such as mura defect caused by light blocking of the spacer, and improving the product yield and efficiency.

An embodiment of the present disclosure further provides a display device, including any of the abovementioned display panels. The display device includes an OLED display device.

The above is only the specific embodiments of the present disclosure, but the protection scope of the present disclosure is not limited thereto. Any change or substitution that can be easily thought of by those skilled in the art within the technical scope disclosed in the present disclosure should be covered within the protection scope of the present disclosure. Therefore, the protection scope of the present disclosure shall be subject to the protection scope of the claims.

What is claimed is:

1. A display panel, comprising:
a plurality of pixel units, arranged on a base substrate in an array; each of the pixel units comprising a pixel circuit and a light-emitting element, the light-emitting element comprising a first electrode connected with the pixel circuit, and the plurality of pixel units comprising a plurality of first pixel units, a plurality of second pixel units, and a plurality of third pixel units, an effective light-emitting area of the first pixel unit being larger than an effective light-emitting area of the second pixel unit, and larger than an effective light-emitting area of the third pixel unit; and
a plurality of first data lines, each of the first data lines is configured to provide a first data signal to the pixel circuit of the first pixel unit,
wherein the first electrode of the first pixel unit, the first electrode of the second pixel unit, and the first electrode of the third pixel unit are arranged apart from each other, and an orthographic projection of the first data line on the base substrate is not overlapped with an orthographic projection of any one of the first electrode of the first pixel unit, the first electrode of the second pixel unit, and the first electrode of the third pixel unit on the base substrate;
the display panel further comprises a first insulating layer, and the first insulating layer comprises a first gate insulating layer, a second gate insulating layer, and an interlayer insulating layer which are stacked arranged;
the display panel further comprises a connection element, and a second insulating layer, wherein the first insulating layer, the connection element, and the second insulating layer are sequentially arranged from a position close to the base substrate to a position far away from the base substrate, the first electrode of the first pixel unit is connected with the pixel circuit through the connection element, the connection element is connected with the pixel circuit through a first via hole penetrating through the first insulating layer, and the first electrode is connected with the connection element through a second via hole penetrating through the second insulating layer, an orthographic projection of the first via hole on the base substrate is not overlapped with an orthographic projection of the second via hole on the base substrate; a distance between a second via hole of the third pixel unit and the first electrode of the first pixel unit which is closest to the second via hole of the third pixel unit is greater than or equal to 3.5 microns, and a distance between the second via hole of the third pixel unit and the first electrode of the second pixel unit which is closest to the second via hole of the third pixel unit is greater than or equal to 3.5 microns.

2. The display panel according to claim 1, wherein connection lines connecting a center of the effective light-emitting area of the first pixel unit, a center of the effective light-emitting area of the second pixel unit, and a center of the effective light-emitting area of the third pixel unit form a triangle, and the first electrode of the second pixel unit and the first electrode of the third pixel units are arranged along an extending direction of the first data line, and the first electrode of the first pixel unit extends along the extending direction of the first data line.

3. The display panel according to claim 2, wherein the triangle is an acute triangle.

4. The display panel according to claim 1, further comprising a plurality of second data lines, wherein each of the second data lines is configured to provide a second data signal to the pixel circuit of the second pixel unit, and an orthographic projection of first electrode of the first pixel unit on the base substrate is overlapped with an orthographic projection of one of the plurality of second data lines on the base substrate.

5. The display panel according to claim 4, wherein orthographic projection of the first electrode of the second pixel unit on the base substrate and orthographic projection of the first electrode of the third pixel unit on the base substrate are not overlapped with orthographic projections of the plurality of second data lines on the base substrate.

6. The display panel according to claim 5, further comprising a plurality of third data lines, wherein each of the third data lines is configured to provide a third data signal to pixel circuit of the third pixel unit, and the first data line, the third data line, and the second data line are arranged along a first direction, and the first direction intersects with the extending direction of the first data line.

7. The display panel according to claim 6, wherein an orthographic projection of at least one of the first electrode of the second pixel unit or the first electrode of the third pixel unit on the base substrate is partially overlapped with an orthographic projection of one of the plurality of third data lines on the base substrate.

8. The display panel according to claim 7, wherein an area of a portion of the first electrode of the first pixel unit overlapped with the second data line is larger than an area of a portion of at least one of the first electrode of the second pixel unit or the first electrode of the third pixel unit overlapped with the third data line.

9. The display panel according to claim 7, wherein orthographic projections of the first electrode of the second pixel unit and the first electrode of the third pixel unit on the base substrate are both overlapped with the orthographic projection of the third data line on the base substrate, the area of the portion of the first electrode of the first pixel unit overlapped with the second data line, the area of the portion of the first electrode of the second pixel unit overlapped with the third data line, and the area of the portion of the first electrode of the third pixel unit overlapped with the third data line sequentially decrease.

10. The display panel according to claim 9, wherein the pixel circuit includes a first transistor, the first transistor comprises a source electrode and a drain electrode, the first electrode of the first pixel unit is connected with the source electrode or the drain electrode of the first transistor through the connection element.

11. The display panel according to claim 1, wherein a dimension of the first via hole in a direction perpendicular to the base substrate is smaller than a dimension of the second via hole in the direction perpendicular to the base substrate.

12. The display panel according to claim 1, wherein a maximum dimension of the first via hole in a plane parallel to the base substrate is smaller than a maximum dimension of the second via hole in the plane parallel to the base substrate.

13. The display panel according to claim 1, wherein the second insulating layer comprises a planarization layer.

14. The display panel according to claim 13, wherein a material of the first insulating layer comprises an inorganic insulating material, and a material of the second insulating layer comprises an organic insulating material.

15. The display panel according to claim 1, wherein an orthographic projection of a connection line between midpoints of two opposite sides of the first pixel unit on the base substrate passes through the orthographic projection of the second via hole on the base substrate, the two opposite sides extend along the extending direction of the first data line, and the second via hole is located at an edge of the first electrode of the first pixel unit.

16. The display panel according to claim 1, wherein a distance between a second via hole of the second pixel unit and the first electrode of the first pixel unit which is closest to the second via hole of the second pixel unit is greater than or equal to 3.5 microns, and a distance between the second via hole of the second pixel unit and the first electrode of the third pixel units which is closest to the second via hole of the second pixel unit is greater than or equal to 3.5 microns.

17. The display panel according to claim 10, wherein the pixel circuit comprises a second transistor, the second transistor is connected with the first transistor and configured to supply a driving current to the light-emitting element, the first electrode of the third pixel unit is not overlapped with the second transistor.

18. A display device, comprising the display panel according to claim 1.

* * * * *